(12) United States Patent
Kim et al.

(10) Patent No.: US 11,574,592 B2
(45) Date of Patent: Feb. 7, 2023

(54) DISPLAY DEVICE

(71) Applicant: Samsung Display Co., Ltd., Yongin-Si (KR)

(72) Inventors: Eung Taek Kim, Hwaseong-si (KR); Hee Yeon Kim, Hwaseong-si (KR); Hwang Sup Shin, Seongnam-si (KR); Na Lae Lee, Suwon-si (KR); Jin Suk Lee, Gwangmyeong-si (KR); Taek Geun Lee, Cheonan-si (KR); Joo Hyeon Jo, Hwaseong-si (KR); Jung Mi Choi, Seoul (KR); Hong Jun Choi, Seoul (KR); Young In Hwang, Suwon-si (KR)

(73) Assignee: Samsung Display Co., Ltd.

(*) Notice: Subject to any disclaimer, the term of this patent is extended or adjusted under 35 U.S.C. 154(b) by 12 days.

(21) Appl. No.: 17/397,878

(22) Filed: Aug. 9, 2021

(65) Prior Publication Data

US 2022/0059031 A1    Feb. 24, 2022

(30) Foreign Application Priority Data

Aug. 24, 2020  (KR) .................. 10-2020-0106320

(51) Int. Cl.
  *G09G 3/3233* (2016.01)
  *H01L 27/32* (2006.01)
  *H01L 29/786* (2006.01)

(52) U.S. Cl.
  CPC ....... *G09G 3/3233* (2013.01); *H01L 27/3262* (2013.01); *H01L 27/3272* (2013.01); *H01L 27/3279* (2013.01); *G09G 2300/0426* (2013.01); *G09G 2300/0819* (2013.01); *G09G 2320/0257* (2013.01); *H01L 29/7869* (2013.01); *H01L 29/78633* (2013.01); *H01L 29/78675* (2013.01)

(58) Field of Classification Search
  CPC ............ H01L 27/3262; H01L 27/3272; H01L 27/3279; H01L 29/78633; G09G 3/3233
  See application file for complete search history.

(56) References Cited

U.S. PATENT DOCUMENTS

| 2007/0070286 A1* | 3/2007 | Cho ..................... G02F 1/13394 349/156 |
| 2017/0160609 A1* | 6/2017 | Lee .................. G02F 1/136204 |
| 2019/0164999 A1* | 5/2019 | Choi ................... H01L 27/3272 |

FOREIGN PATENT DOCUMENTS

| KR | 10-0485531 B1 | 4/2005 |
| KR | 2016-0029945 A | 3/2016 |
| KR | 2019-0100554 A | 8/2019 |
| KR | 2020-0009171 A | 1/2020 |

* cited by examiner

*Primary Examiner* — Kevin M Nguyen
(74) *Attorney, Agent, or Firm* — Innovation Counsel LLP

(57) ABSTRACT

A display device includes a base substrate including a first substrate and a second substrate sequentially laminated, a lower semiconductor layer disposed on at least one of the first substrate and the second substrate, a buffer layer disposed on the base substrate, an active semiconductor layer disposed on the buffer layer and including a first active layer of a first transistor and a second active layer of a second transistor, a first insulating layer disposed on the active semiconductor layer, and a first conductive layer disposed on the first insulating layer and including a first gate electrode of the first transistor and a second gate electrode of the second transistor, wherein the lower semiconductor layer overlaps the first active layer, and does not overlap the second active layer.

20 Claims, 20 Drawing Sheets

FIG. 2
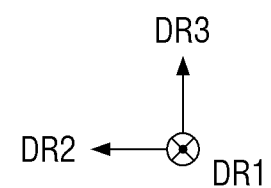

100: CH3_1, CH3_2, CA

DISPLAY DEVICE

This application claims priority from Korean Patent Application No. 10-2020-0106320 filed on Aug. 24, 2020 in the Korean Intellectual Property Office, and the benefits accruing therefrom under 35 U.S.C. 119, the disclosure of which is herein incorporated by reference in its entirety.

BACKGROUND

1. Field of the Invention

The present disclosure relates to a display device.

2. Description of the Related Art

A display device displays images for various electronic appliances, such as smart phones, tablet personal computers (PCs), digital cameras, notebook computers, navigators, and televisions (TVs).

A display device may be a flat panel display device such as a liquid crystal display device, a field emission display device, or an organic light emitting display device. Among various flat panel display devices, an organic light emitting display device includes a display panel arranged with light emitting elements without a backlight that provides light to the display panel.

SUMMARY

The present disclosure provides a display device having improved element characteristics of semiconductor elements for driving a light emitting element.

However, the present disclosure is not restricted to the examples and/or embodiments set forth herein. The present disclosure will become more apparent to one of ordinary skill in the art by referencing the detailed description of the present disclosure given below.

According to an embodiment of the present disclosure, a display device includes a base substrate including a first substrate and a second substrate sequentially laminated, a lower semiconductor layer disposed on at least one of the first substrate and the second substrate, a buffer layer disposed on the base substrate, an active semiconductor layer disposed on the buffer layer and including a first active layer of a first transistor and a second active layer of a second transistor, a first insulating layer disposed on the active semiconductor layer, and a first conductive layer disposed on the first insulating layer and including a first gate electrode of the first transistor and a second gate electrode of the second transistor, wherein the lower semiconductor layer overlaps the first active layer, and does not overlap the second active layer.

The display device may further include a light emitting element. The first transistor may include a first electrode and a second electrode and control a driving current flowing from the first electrode to the second electrode according to a voltage applied to the first gate electrode. The second transistor may be disposed between the first gate electrode and the first electrode of the first transistor. The light emitting element may be electrically connected to the second electrode of the first transistor and emits light according to the driving current.

The lower semiconductor layer may include amorphous silicon.

The active semiconductor layer may include at least one of polycrystalline silicon and an oxide semiconductor.

The lower semiconductor may include an opening that overlaps at least a portion of a channel region of the second transistor in a thickness direction.

The lower semiconductor layer may be disposed between the first substrate and the second substrate, and the lower semiconductor layer may have a thickness ranging from 1 nm to 5 nm.

The lower semiconductor layer may be disposed above the first substrate and the second substrate, and the lower semiconductor layer may have a thickness ranging from 20 nm to 50 nm.

The display device may further include a second insulating layer disposed on the first conductive layer, and a light blocking pattern disposed on the second insulating layer and at least partially overlapping the second active layer of the second transistor. A same voltage may be applied to the light blocking pattern and the second gate electrode of the second transistor.

The display device may further include a third insulating layer disposed on the light blocking pattern, and a second conductive layer disposed on the third insulating layer and including a connection pattern. The first conductive layer may further include a first scan line electrically connected to the first gate electrode of the first transistor and the second gate electrode of the second transistor. The connection pattern may be electrically connected to the light blocking pattern through a first contact hole that penetrates through the third insulating layer to expose the light blocking pattern, and may further be electrically connected to the first scan line through a second contact hole that penetrates through the third insulating layer and the second insulating layer to expose the first scan line.

A scan signal may be applied to the light blocking pattern and the second gate electrode of the second transistor.

The second conductive layer may further include the first electrode and the second electrode of the first transistor.

The first conductive layer may further include a first scan line electrically connected to the first gate electrode of the first transistor and the second gate electrode of the second transistor. The light blocking pattern may overlap the first scan line. In an area overlapping the first scan line, the light blocking pattern may be electrically connected to the first scan line through a third contact hole that penetrates through the second insulating layer to expose the first scan line.

The second transistor may include a first sub-transistor and a second sub-transistor to which a same scan signal is applied. The light blocking pattern may overlap a connection region that connects a first channel region of the first sub-transistor and a second channel region of the second sub-transistor.

According to an embodiment of the present disclosure, a display device includes a first transistor including a first active layer including a first channel region overlapping a first gate electrode and controlling a driving current flowing through the first channel region according to a voltage applied to the first gate electrode, a light emitting element electrically connected to the first transistor and emitting light according to the driving current, a second transistor electrically connected to the first gate electrode of the first transistor and including a second active layer including a second channel region, and a lower semiconductor layer disposed under the first active layer of the first transistor and overlapping at least a portion of the first channel region of the first transistor, wherein the lower semiconductor layer does not overlap the second channel region of the second transistor.

The lower semiconductor layer may include amorphous silicon.

Each of the first active layer and the second active layer may include at least one of polycrystalline silicon and an oxide semiconductor.

According to an embodiment of the present disclosure, a display device includes a substrate, a lower semiconductor layer disposed on the substrate, a buffer layer disposed on the lower semiconductor layer, a first transistor including a first sub-transistor and a second sub-transistor, an active semiconductor layer disposed on the buffer layer and including a first channel region of the first sub-transistor and a second channel region of the second sub-transistor, a first insulating layer disposed on the active semiconductor layer, a first conductive layer disposed on the first insulating layer including a first gate electrode of the first sub-transistor and a second gate electrode of the second sub-transistor, a second insulating layer disposed on the first conductive layer, and a light blocking pattern disposed on the second insulating layer and overlapping a connection region that connects the first channel region of the first sub-transistor and the second channel region of the second sub-transistor, wherein a same voltage is applied to the light blocking pattern, the first sub-transistor, and the second sub-transistor.

The lower semiconductor layer may not overlap the first channel region of the first sub-transistor and the second channel region of the second sub-transistor.

The display device may further include a third insulating layer covering the light blocking pattern, and a second conductive layer disposed on the third insulating layer and including a connection pattern. The first conductive layer may further include a first scan line electrically connected to the first gate electrode of the first sub-transistor and the second gate electrode of the second sub-transistor. The connection pattern may be electrically connected to the light blocking pattern through a first contact hole that penetrates through the third insulating layer to expose the light blocking pattern, and may further be electrically connected to the first scan line through a second contact hole that penetrates through the third insulating layer and the second insulating layer to expose the first scan line.

The first conductive layer may further include a first scan line electrically connected to the first gate electrode of the first sub-transistor and the second gate electrode of the second sub-transistor. The light blocking pattern may overlap the first scan line. In an area overlapping the first scan line, the light blocking pattern may be electrically connected to the first scan line through a third contact hole that penetrates through the second insulating layer to expose the first scan line.

The display device disclosed herein can improve characteristics of semiconductor elements for driving a light emitting element.

The effects of the present disclosure are not limited by the foregoing, and other various effects are anticipated herein without deviating from teachings of the present disclosure.

BRIEF DESCRIPTION OF THE DRAWINGS

The above and other aspects and features of the present disclosure will become more apparent by describing in detail embodiments thereof with reference to the attached drawings, in which:

FIG. 2 is a side view of the display device of FIG. 1 illustrating a side shape of the display device in a state where it is bent in a thickness direction;

DETAILED DESCRIPTION OF THE EMBODIMENTS

The present disclosure will now be described more fully hereinafter with reference to the accompanying drawings, in which some embodiments of the present disclosure are shown. The present disclosure may, however, be embodied in different forms and/or configurations and should not be construed as limited to the embodiments set forth herein. Rather, these embodiments are provided so that the present disclosure will be thorough and complete, and will fully convey the scope of the inventive concepts of the present disclosure to those skilled in the art.

It will also be understood that when a layer is referred to as being "on" another layer or substrate, it can be directly on the other layer or substrate, or one or more intervening layers may also be present therebetween. The same reference numbers indicate the same components throughout the present disclosure. In the attached figures, the thicknesses of layers and regions may be exaggerated for clarity.

Although the terms "first," "second," etc. may be used herein to describe various elements, these elements, should not be limited by these terms. These terms may be used to distinguish one element from another element. Thus, a first element discussed below may be termed a second element without departing from the teachings of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

Hereinafter, embodiments of the present disclosure will be described with reference to the attached drawings.

Figure 1:
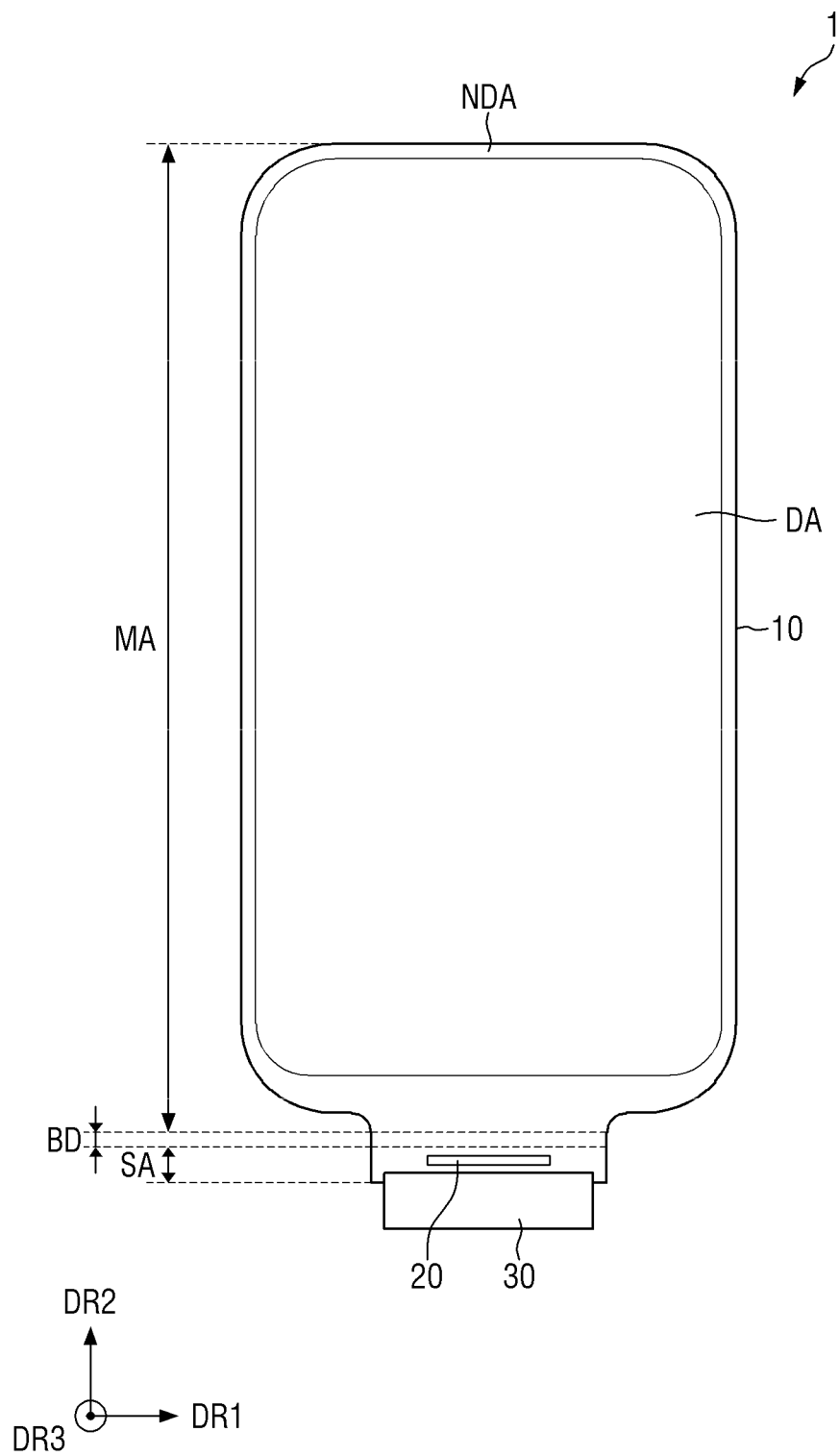
FIG. 1 is a plan view of a display device according to an embodiment.

FIG. 1 is a plan view of a display device according to an embodiment. FIG. 2 is a side view of the display device of FIG. 1. FIG. 2 illustrates a side shape of the display device in a state where it is bent in a thickness direction.

A display device 1 for displaying a moving image or a still image may be used as a display screen of various products such as televisions, notebooks, monitors, billboards, internet of things (IOTs) as well as portable electronic appliances such as mobile phones, smart phones, tablet personal computers (PCs), smart watches, watch phones, mobile communication terminals, electronic notebooks, electronic books, portable multimedia players (PMPs), navigators, and ultra-mobile PCs (UMPCs).

The display device 1 according to an embodiment may have a substantially rectangular shape in a plan view. For example, the display device 1 may have a rectangular shape with sharp corners in a plan view. However, the present disclosure is not limited thereto, and the display device 1 may have a rectangular shape with rounded corners in a plan view.

In the drawings, the first direction DR1 represents a horizontal direction of the display device 1, and the second direction DR2 represents a vertical direction of the display device 1 in a plan view. The third direction DR3 represents a thickness direction of the display device 1. The first direction DR1 and the second direction DR2 intersect each other in a direction perpendicular to each other, and the third direction DR3 intersects both the first direction DR1 and the second direction DR2 in a direction intersecting a plane defined by the first direction DR1 and the second direction DR2. However, these directions mentioned should be understood as relative directions, and the present disclosure is not limited to the above-mentioned directions.

Unless otherwise explicitly defined, as used herein, "upper portion," "upper surface," and "upper side" expressed based on the third direction DR3 mean one side of a display surface based on the display device 1, and "lower portion," "lower surface," and "lower side" expressed based on the third direction DR3 mean an opposite side of the display surface based on the display device 1.

Referring to FIGS. 1 and 2, the display device 1 may include a display panel 10. The display panel 10 may be a flexible substrate including a flexible polymer material such as polyimide. In this case, the display panel 10 may be warped, bent, folded, or rolled.

The display panel 10 may be an organic light emitting display panel. In the following embodiments, an organic light emitting display panel is described as a non-limiting example of the display panel 10, but the present disclosure is not limited thereto, and other types of display panels such as a liquid crystal display (LCD) panel, a quantum dot organic light emitting display (QD-OLED) panel, a quantum dot liquid crystal display (QD-LCD) panel, a quantum nano light emitting display panel (nano NED), and a micro light emitting diode (LED) may be used without deviating from the scope of the present disclosure.

The display panel 10 may include a display area DA in which an image is displayed, and a non-display area NDA in which an image is not displayed. The display panel 10 may be divided into the display area DA and the non-display area NDA in a plan view. The non-display area NDA may be disposed to surround the display area DA. The non-display area NDA may correspond to a bezel area of the display device 1.

The display area DA may have a rectangular shape with sharp corners or a rectangular shape with rounded corners. However, the planar shape of the display area DA is not limited to a rectangle, and may have a circular shape, an elliptical shape, or other various shapes.

The display area DA may include a plurality of pixels. The pixels may be arranged in a matrix shape. Each pixel may include a light emitting layer and a circuit layer that controls an amount of light emitted from the light emitting layer. The circuit layer may include signal lines, electrodes, and at least one transistor. The light emitting layer may include an organic light emitting material. The light emitting layer may be sealed by an encapsulation layer. A detailed configuration of the pixel will be described later.

The non-display area NDA may surround all the sides of the display area DA, and may form a frame of the display area DA. However, the present disclosure is not limited thereto.

The display panel 10 may include a main area MA and a bending area BD connected to one side of the main area MA in the second direction DR2. The display panel 10 may further include a sub-area SA connected to one side of the bending area BD in the second direction DR2. The bending area BD may be bent in a thickness direction (e.g., the third direction DR3) to overlap the main area MA and the sub-area SA in the thickness direction.

The display area DA may be located in the main area MA. The non-display area NDA may be arranged at a peripheral edge portion of the display area DA of the main area MA.

The main area MA may have a shape similar to the planar shape of the display device 1. The main area MA may have a flat planar area. However, the present disclosure is not limited thereto, and the main area MA may have at least one bent edge among the edges other than the edge (side) connected to the bending area BD and may form a curved surface.

In the main area MA having at least one bent edge, the display area DA may be disposed at the corresponding edge. However, the present disclosure is not limited thereto, and the non-display area NDA not displaying an image may be disposed at the curved surface or the bent edge, or both the display area DA and the non-display area NDA may be at the curved surface or the bent edge.

The non-display area NDA of the main area MA may correspond to an area from the outer boundary of the display area DA to the edge of the display panel 10. Signal lines or driving circuits for applying signals to the display area DA may be arranged in the non-display area NDA.

The bending area BD may be connected through one short side of the main area MA. The width of the bending area BD (a width measured in the first direction DR1) may be smaller than the width of the main area MA (a width of the short side of the main area MA). The connection portion between the main area MA and the bending area BD may have an L-shaped shape to reduce the width of the bezel area of the display device 1.

In the bending area BD, the display panel 10 may be bent with a curvature in a direction opposite to the display surface. As the display panel 10 is bent in the bending area BD, the surface of the display panel 10 may be reversed. That is, one surface of the display panel 10 facing upward in the main area MA may be changed to face an outer side of the side surface in the bending area BD and then face the lower side of the display panel 10 in the sub-area SA.

The sub-area SA extends from the bending area BD and continue to extend in a direction parallel to the main area MA. The sub-area SA may overlap the main area MA in the thickness direction of the display panel 10. The sub-area SA may overlap the non-display area NDA at the edge of the main area MA, and may overlap the display area DA of the main area MA. The width of the sub-area SA may be the same as the width of the bending area BD, but the present disclosure is not limited thereto.

A pad portion (not shown) may be disposed in the sub-area SA of the display panel 10. An external device may be mounted (or attached) onto the pad portion. For example, the external device may include a driving chip 20 and a driving substrate 30 implemented as a flexible printed circuit board or a rigid printed circuit board. In addition, a line connection film, a connector, and the like may be mounted on the pad portion. One external device may be mounted on the sub-area SA, but a plurality of external devices may also be mounted thereon. As shown FIGS. 1 and 2, the driving chip 20 may be disposed in the sub-area SA of the display panel 10, and the driving substrate 30 may be attached to an end of the sub-area SA. In this case, the display panel 10 may include both a first pad portion connected to the driving chip 20 and a second pad portion connected to the driving substrate 30. As another example, the driving chip 20 may be mounted on a film, and the film may be attached to the sub-area SA of the display panel 10.

The driving chip 20 is mounted on an upper surface of the display panel 10, and the one surface may correspond to a display surface. However, as described above, as the bending area BD is bent, the upper surface of the display panel 10 on which the driving chip 20 is mounted faces downward in the sub-area SA.

The driving chip 20 may be attached onto the display panel 10 through an anisotropic conductive film, or may be attached onto the display panel 10 through ultrasonic bonding. The driving chip 20 may include an integrated circuit that drives the display panel 10.

Figure 3:
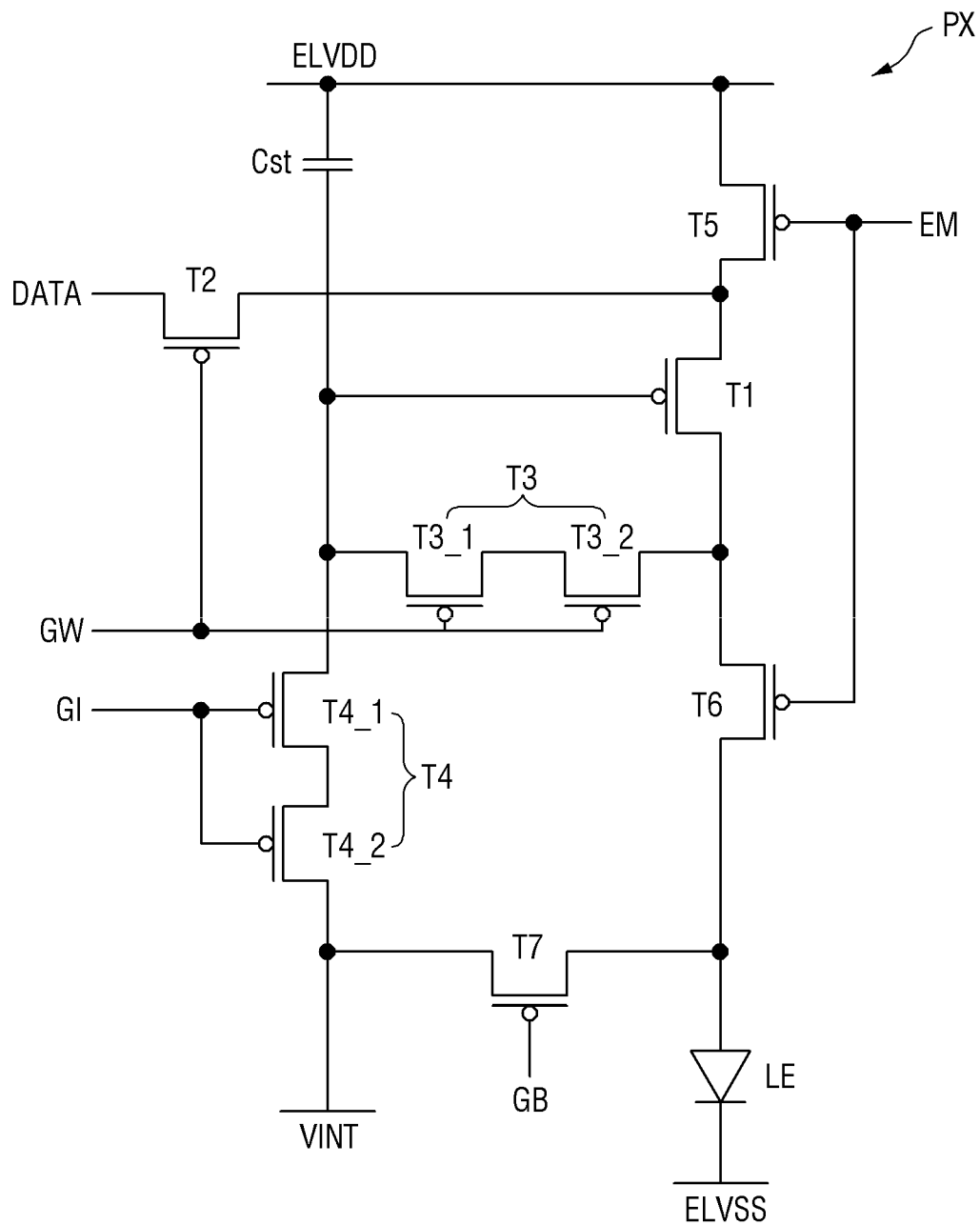
FIG. 3 is a circuit diagram specifically illustrating a pixel according to an embodiment.

FIG. 3 is a circuit diagram specifically illustrating a pixel according to an embodiment.

Referring to FIG. 3, the circuit of a pixel PX includes a plurality of transistors T1 to T7, a capacitor Cst, and a light emitting element LE. A data signal DATA, a first scan signal GW, a second scan signal GI, a third scan signal GB, a light emission control signal EM, a first power voltage ELVDD, a second power voltage ELVSS, and an initialization voltage VINT are applied to the circuit of the pixel PX.

Figure 7:
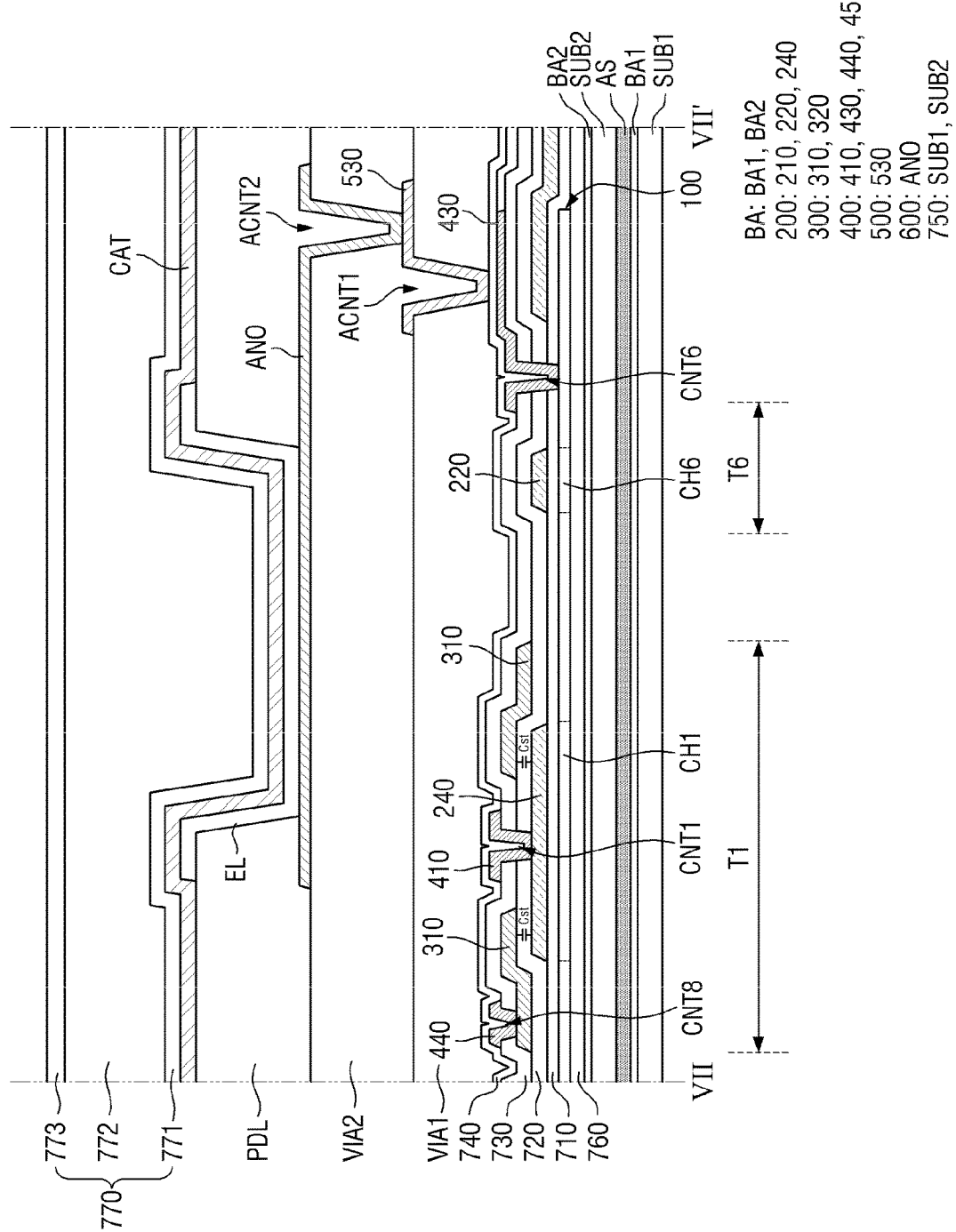
FIG. 7 is a cross-sectional view taken along the line VII-VII' in FIG. 4.

The light emitting element LE may be, but is not limited to, an organic light emitting diode including a first electrode (or an anode electrode, refer to 'ANO' in FIG. 7), a light emitting layer (refer to 'EL' in FIG. 7), and a second electrode (or a cathode electrode, refer to 'CAT' in FIG. 7).

The plurality of transistors may include first to seventh transistors T1 to T7. Each of the transistors T1 to T7 includes a gate electrode, a first electrode, and a second electrode.

Any one of the first electrode and second electrode of each of the transistors T1 to T7 is a source electrode, and the other thereof is a drain electrode.

The first transistor T1 may serve as a driving transistor, and the second to seventh transistors T2 to T7 may serve as switching transistors.

Each of the transistors T1 to T7 may be a thin film transistor. Each of the transistors T1 to T7 may be one of a P-channel metal-oxide-semiconductor (PMOS) transistor and an N-channel metal-oxide-semiconductor (NMOS) transistor. In an embodiment, all of the transistors T1 to T7 may be PMOS transistors. The first transistor T1 may be referred to as a driving transistor, the second transistor T2 may be referred to as a data transfer transistor, the third transistor T3 may be referred to as a compensation transistor, the fourth transistor T4 may be referred to as a first initialization transistor, the fifth transistor T5 may be referred to as a first light emission control transistor, the sixth transistor T6 may be referred to as a second light emission control transistor, and the seventh transistor T7 may be referred to as a second initialization transistor.

Hereinafter, each configuration of each of the transistors T1 to T7 will be described in detail.

The gate electrode of the first transistor T1 is connected to the first electrode of the capacitor Cst. The first electrode of the first transistor T1 is connected to a first driving voltage line providing the first power voltage ELVDD through the fifth transistor T5. The second electrode of the first transistor T1 is connected to the first electrode of the light emitting element LE through the sixth transistor T6. The first transistor T1 receives the data signal DATA according to the switching operation of the second transistor T2 and supplies a driving current to the light emitting element LE.

The gate electrode of the second transistor T2 is connected to a first scan line providing the first scan signal GW. The first electrode of the second transistor T2 is connected to a data signal line providing the data signal DATA. The second electrode of the second transistor T2 is connected to the first electrode of the first transistor T1 and is connected to the first driving voltage line providing the first power voltage ELVDD through the fifth transistor T5. The second transistor T2 is turned on according to the first scan signal GW and performs a switching operation of transmitting the data signal DATA to the first electrode of the first transistor T1.

The third transistor T3 may be formed as a dual transistor including a first sub-transistor T3_1 and a second sub-transistor T3_2. The gate electrode of the first sub-transistor T3_1 may be connected to the first scan line providing the first scan signal GW, the first electrode thereof may be connected to the second electrode of the second sub-transistor T3_2, and the second electrode thereof may be connected to the first electrode of the capacitor Cst and the gate electrode of the first transistor T1. The gate electrode of the second sub-transistor T3_2 may be connected to the first scan line providing the first scan signal GW, the first electrode thereof may be connected to the second electrode of the first transistor T1, and the second electrode thereof may be connected to the first electrode of the first sub-transistor T3_1.

The first sub-transistor T3_1 and the second sub-transistor T3_2 are turned on according to the first scan signal GW and connect the gate electrode and the second electrode of the first transistor T1 to diode-connect the first transistor T1. Accordingly, a voltage difference may occur between the first electrode and the gate electrode of the first transistor T1 by a threshold voltage of the first transistor T1, and the data signal DATA that may be compensated by the threshold voltage of the first transistor T1 may be supplied to the gate electrode of the first transistor T1, thereby compensating for a deviation due to the threshold voltage of the first transistor T1.

The fourth transistor T4 may also be formed as a dual transistor including a third sub-transistor T4_1 and a fourth sub-transistor T4_2. The gate electrode of the third sub-transistor T4_1 may be connected to a second scan line providing the second scan signal GI, the first electrode thereof may be connected to the first electrode of the capacitor Cst, the second electrode of the first sub-transistor T3_1, and the gate electrode of the first transistor T1, and the second electrode thereof may be connected to the first electrode of the fourth sub-transistor T4_2. The gate electrode of the fourth sub-transistor T4_2 may be connected to the second scan line providing the second scan signal GI, the first electrode thereof may be connected to the second electrode of the third sub-transistor T4_1, and the second electrode thereof may be connected to an initialization voltage line providing the initialization voltage VINT. The third sub-transistor T4_1 and the fourth sub-transistor T4_2 are turned on according to the second scan signal GI and transmit the initialization voltage VINT to the gate electrode of the first transistor T1 to perform an operation of initializing the voltage of the gate electrode of the first transistor T1.

The gate electrode of the fifth transistor T5 is connected to a light emission control line providing the light emission control signal EM, the first electrode thereof is connected to the first driving voltage line providing the first power voltage ELVDD, and the second electrode thereof is connected to the first electrode of the first transistor T1. The fifth transistor T5 is turned on according to the light emission control signal EM and connects the first electrode of the first transistor T1 and the first driving voltage line providing the first power voltage ELVDD.

The sixth transistor T6 is connected between the second electrode of the first transistor T1 and the first electrode of the light emitting element LE. The gate electrode of the sixth transistor T6 is connected to the light emission control line providing the light emission control signal EM, the first electrode thereof is connected to the second electrode of the first transistor T1 and the first electrode of the second sub-transistor T3_2, and the second electrode thereof is connected to the first electrode of the light emitting element LE.

The fifth transistor T5 and the sixth transistor T6 may be simultaneously turned on according to the light emission control signal EM, and the driving current supplied by the first transistor T1 may flow through the light emitting element LE.

The gate electrode of the seventh transistor T7 is connected to a third scan signal providing the third scan signal GB. The first electrode of the seventh transistor T7 is connected to the first electrode of the light emitting element LE. The second electrode of the seventh transistor T7 is connected to the initialization voltage line providing the initialization voltage VINT. The seventh transistor T7 is turned on according to the third scan signal GB and initializes the first electrode of the light emitting element LE.

Although the present embodiment describes that the gate electrode of the seventh transistor T7 receives the third scan signal GB, in another embodiment, the circuit of the pixel PX may be configured such that the gate electrode of the seventh transistor T7 receives the light emission control signal EM or the second scan signal GI.

The capacitor Cst is formed between the gate electrode of the first transistor T1 and the first driving voltage line providing the first power voltage ELVDD. The first electrode of the capacitor Cst may be connected to the gate electrode of the first transistor T1, the second electrode of the first sub-transistor T3_1, and the first electrode of the third sub-transistor T4_1, and the second electrode of the capacitor Cst may be connected to the first driving voltage line providing the first power voltage ELVDD. The capacitor Cst may serve to constantly maintain a data voltage applied to the gate electrode of the first transistor T1.

The second electrode of the light emitting element LE is connected to a second driving voltage line providing the second power voltage ELVSS. The light emitting element LE displays an image by emitting light according to the driving current supplied by the first transistor T1.

Hereinafter, the planar arrangement and cross-sectional structure of the aforementioned pixel PX will be described in detail.

Figure 4:
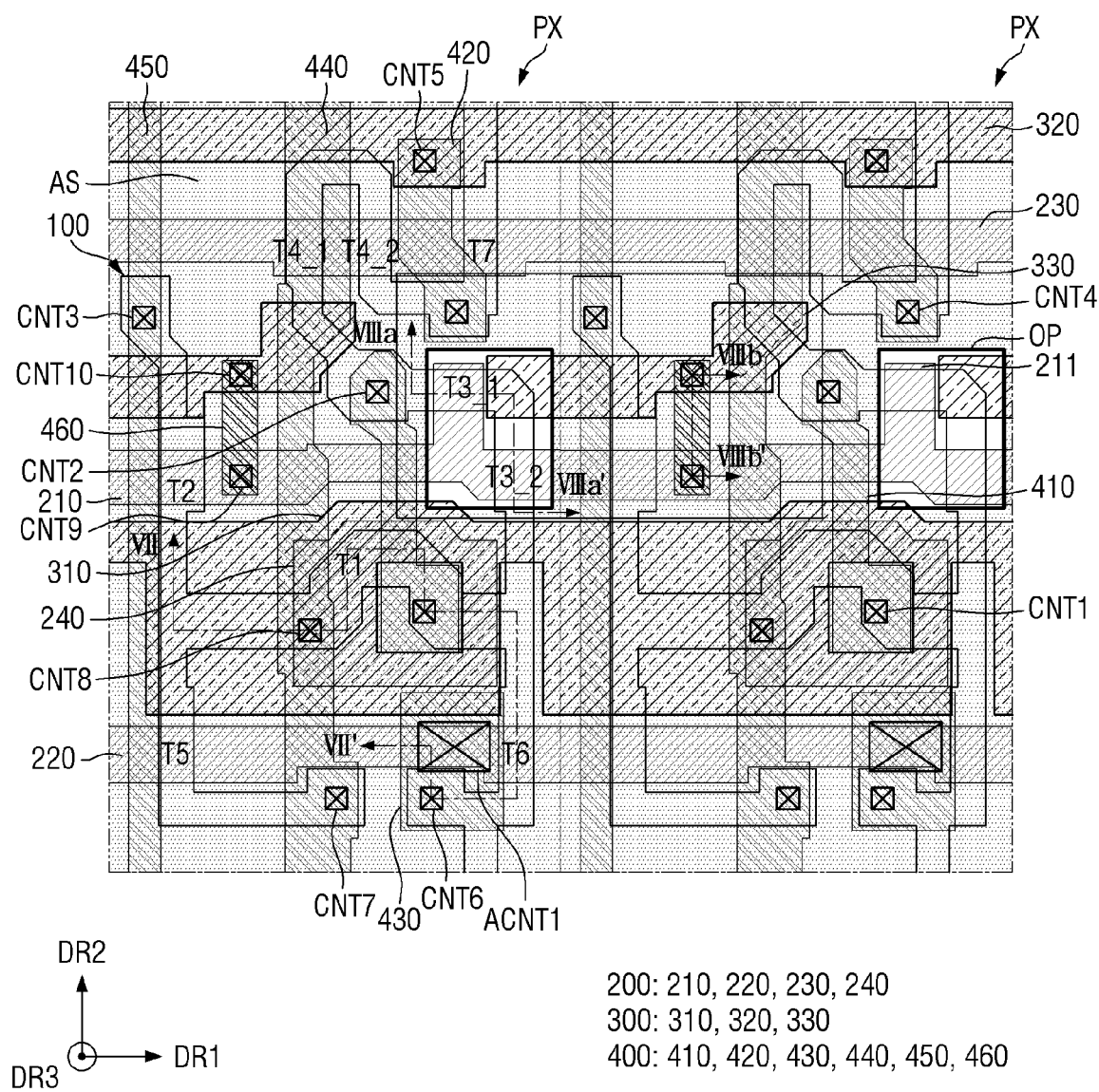
FIG. 4 is a layout view of a pixel of a display device according to an embodiment.
Figure 5:
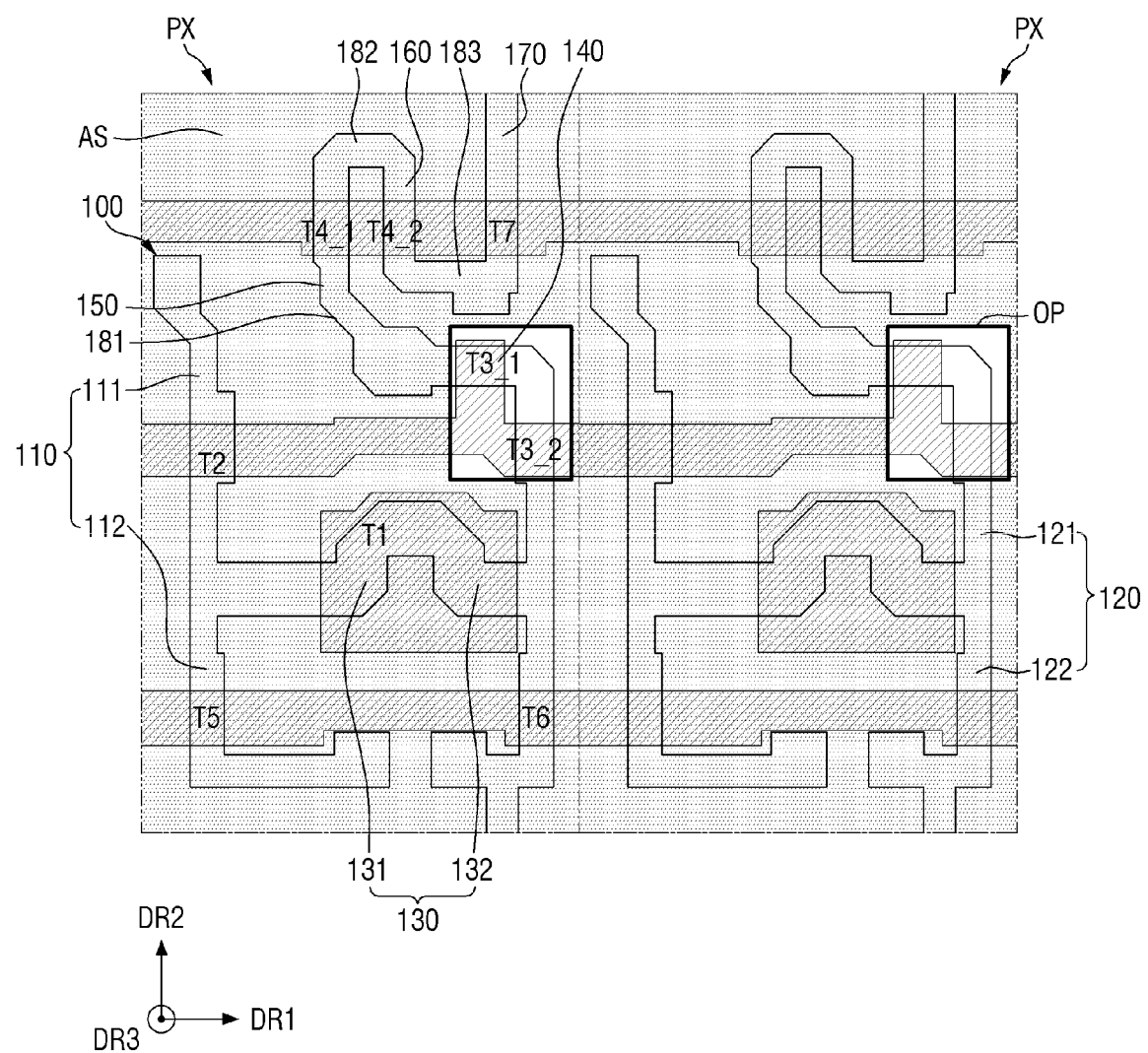
FIG. 5 is a layout view of a lower semiconductor layer, a semiconductor layer, and a first conductive layer of FIG. 4.
Figure 6:
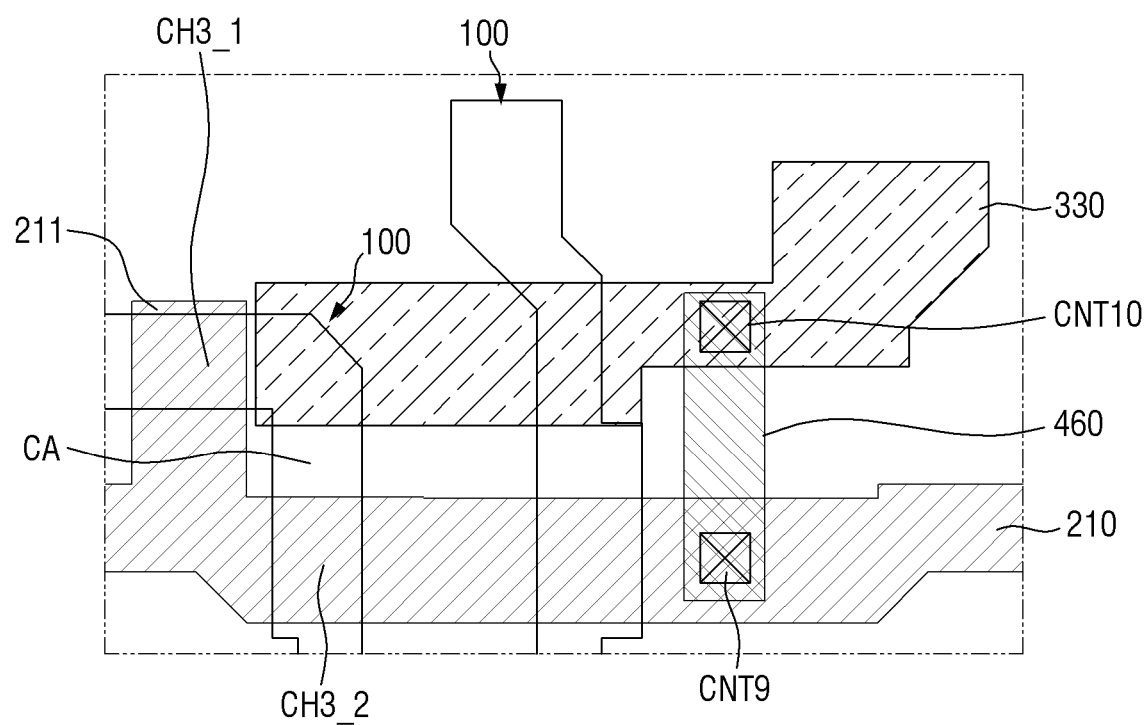
FIG. 6 is an enlarged view of a periphery of a light blocking pattern of FIG. 5.
Figure 8:
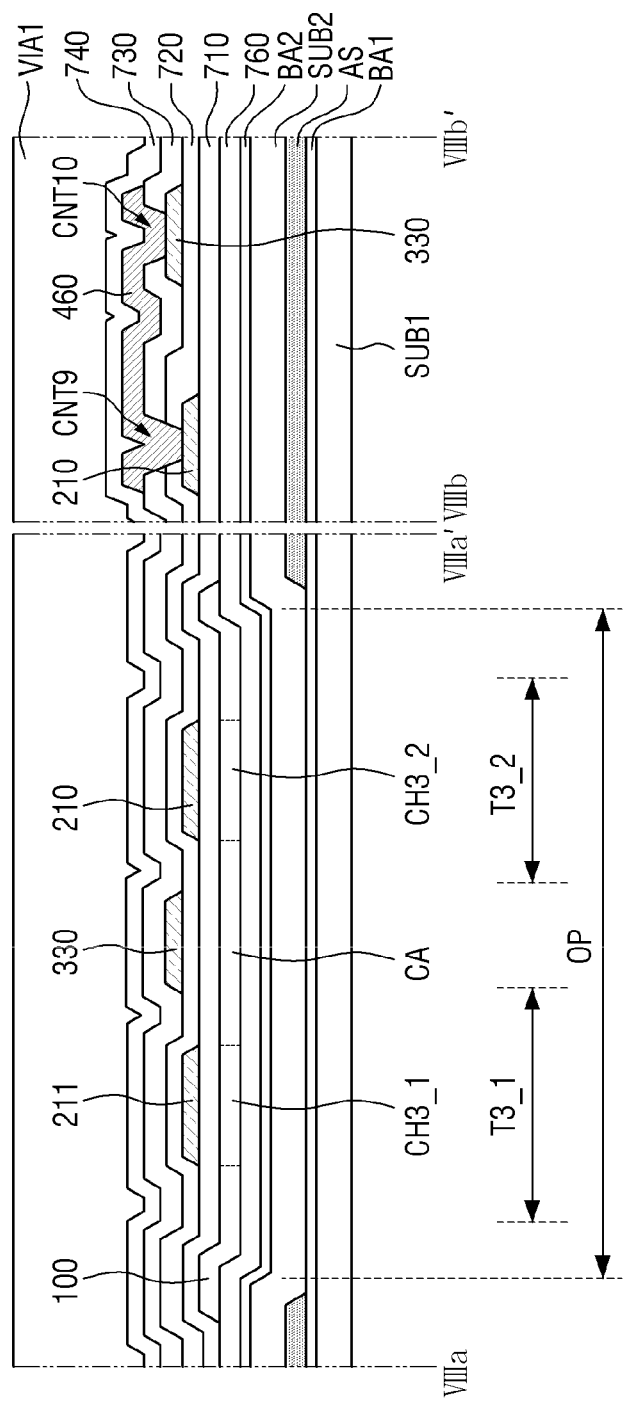
FIG. 8 illustrates a part of a cross-sectional view taken along the lines VIIIa-VIIIa' and VIIIb-VIIIb' in FIG. 4.

FIG. 4 is a layout view of a pixel of a display device according to an embodiment. FIG. 5 is a layout view of a lower semiconductor layer, a semiconductor layer, and a first conductive layer of FIG. 4. FIG. 6 is an enlarged view of a periphery of a light blocking pattern of FIG. 5. FIG. 7 is a cross-sectional view taken along the line VII-VII' in FIG. 4. FIG. 8 illustrates a part of a cross-sectional view taken along the lines VIIIa-VIIIa' and VIIIb-VIIIb' in FIG. 4.

For convenience of description, FIG. 6 shows an enlarged view of the periphery of a light blocking pattern 330 according to an embodiment. FIG. 7 further illustrates an organic light emitting element of the pixel including an anode electrode ANO, a light emitting layer EL, a cathode electrode CAT, and a thin film encapsulation layer disposed thereon.

In the following embodiments, although some components are substantially the same as the components described with respect to FIGS. 1 to 3, new reference numerals are assigned to easily describe the arrangement and coupling relationship between the components.

Referring to FIGS. 3 to 8, the pixel PX includes the plurality of transistors T1 to T7, the capacitor Cst), and the light emitting element 'LE.

The capacitor Cst includes conductive layers that correspond to the first electrode and the second electrode, and an insulating layer disposed between the conductive layers. The light emitting element LE (e.g., an organic light emitting diode (OLED)) includes conductive layers forming the anode electrode ANO and the cathode electrode CAT, and an organic light emitting layer disposed therebetween. The electrical connections of the respective components may be performed by a wiring made of a conductive layer and/or a via made of a conductive material. The above-described conductive material, conductive layer, semiconductor layer, insulating layer, light emitting layer, etc. may be disposed on a base substrate 750.

The respective layers of the pixel PX may be arranged in order of the base substrate 750, a barrier layer BA, a lower semiconductor layer AS, a buffer layer 760, an active semiconductor layer 100, a first insulating layer 710, a first conductive layer 200, a second insulating layer 720, a second conductive layer 300, a third insulating layer 730, a third conductive layer 400, a protective layer 740, a first via layer VIA1, a fourth conductive layer 500, a second via layer VIA2, the fifth conductive layer 600, a pixel defining layer PDL, the light emitting layer EL, and the cathode electrode CAT. Each of the above-described layers may be formed as a single layer or a laminated layer including a plurality of layers. An additional layer may be further disposed between the respective layers.

The base substrate 750 may have a plurality of laminated structures. The base substrate 750 may include a first substrate SUB1 and a second substrate SUB2. The first substrate SUB1 and the second substrate SUB2 may be sequentially laminated. The base substrate 750 supports the layers disposed thereon. In a case where the organic light emitting display device is a back or double-sided light emission type display device, the base substrate 750 may be a transparent substrate. In a case where the organic light emitting display device is a front emission type display device, the base substrate 750 may be not only a transparent substrate but also a translucent or opaque substrate.

The base substrate 750 may be made of an insulating material such as glass, quartz, or polymer resin. Examples of the polymer resin may include, but are not limited to, polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CTA), cellulose acetate propionate (CAP), and a combination thereof. The base substrate 750 may also include a metal.

The base substrate 750 may be a rigid substrate, or may be a flexible substrate capable of being bent, folded, rolled or the like. An example of the material constituting the flexible substrate may be polyimide (PI), but is not limited thereto.

The barrier layer BA may be disposed on the entire surface of the base substrate 750. The barrier layer BA may prevent diffusion of impurity ions and/or penetration of moisture or outside air, and may planarize a surface. The barrier layer BA may include silicon oxide ($SiO_x$) However, the present disclosure is not limited thereto, and the barrier layer BA may include silicon nitride ($SiN_x$) or silicon oxynitride ($SiO_xN_y$).

The barrier layer BA may have a plurality of laminated structures. For example, the barrier layer BA may include a first barrier layer BA1 and a second barrier layer BA2. The first barrier layer BA1 may be disposed on the first substrate SUB1, and the second barrier layer BA2 may be disposed on the second substrate SUB2. The barrier layer BA may be omitted depending on the type or process conditions of the base substrate 750.

The lower semiconductor layer AS may be disposed between the first substrate SUB1 and the second substrate SUB2 of the base substrate 750. The lower semiconductor layer AS may be disposed between the first barrier layer BA1 and the second barrier layer BA2 of the barrier layer BA, but the present disclosure is not limited thereto. The lower semiconductor layer AS may include amorphous silicon. However, the present disclosure is not limited thereto, and the lower semiconductor layer AS may include at least one of polycrystalline silicon and oxide silicon. The thickness of the lower semiconductor layer AS may be, but is not limited to, for example, 1 nm to 5 nm or 0.1 nm to 10 nm.

The lower semiconductor layer AS that is disposed between the first substrate SUB1 and the second substrate SUB2 and has a thickness of 5 nm or less or 10 nm or less may prevent a disconnection that may be caused by a step in the active semiconductor layer 100 during crystallization process of amorphous silicon since the lower semiconductor layer AS is not directly disposed under a part of the active semiconductor layer 100. Further, the lower semiconductor layer AS may be used as an alignment mark in the process of etching the active semiconductor layer 100, and the lower semiconductor layer AS that is disposed between the first substrate SUB1 and the second substrate SUB2 and has a thickness of 0.1 nm or more or 1 nm or more may prevent a recognition failure of the alignment mark, thereby improving the reliability of an element.

The lower semiconductor layer AS may firmly attach the components laminated thereon and thereunder to each other. For example, the first substrate SUB1 and the second substrate SUB2 disposed on and under the lower semiconductor layer AS may be more firmly attached to each other. Accordingly, the base substrate 750 and/or the barrier layer BA may prevent diffusion of impurity ions and/or penetration of moisture or outside air while planarizing a surface.

Referring to FIG. 5, the lower semiconductor layer AS may be disposed under the first transistor T1, but may not be disposed under the third transistor T3 (T3_1 and T3_2). For example, the lower semiconductor layer AS may overlap at least a channel region CH1 of the first transistor T1 in the thickness direction, and may not overlap at least a channel region CH3_1 or CH3_2 of the third transistor T3 (T3_1 and T3_2).

Although not limited thereto, for example, the lower semiconductor layer AS may be disposed on the surface of the base substrate 750 and may include an opening OP in the thickness direction. The opening OP may have various shapes in a plan view. For example, the opening OP may have a rectangular shape, but is not limited thereto, and may include other polygonal shapes such as a square and a pentagon, or may include a circular shape or an elliptic shape. The opening OP may be disposed in an area where the channel region CH3_1 or CH3_2 of the third transistor T3 (T3_1 and T3_2) is disposed. The lower semiconductor layer AS may be initially disposed on the entire surface of the base substrate 750, and may be selectively removed from the area where the third transistor T3 is disposed.

In this case, the lower semiconductor layer AS may overlap the channel region CH1 of the first transistor T1 in the thickness direction. In addition, the lower semiconductor layer AS may overlap the channel region of each of the second transistor T2, the fourth transistor T4 (T4_1 and T4_2), the fifth transistor T5, the sixth transistor T6, and the seventh transistor T7 in the thickness direction. The channel region CH3_1 or CH3_2 of the third transistor T3 (T3_1 and T3_2) may overlap the opening OP in the thickness direction, so the third transistor T3 (T3_1 and T3_2) may not overlap the lower semiconductor layer AS. In other words, the opening OP may surround the channel region CH3_1 or CH3_2 of the third transistor T3 (T3_1 and T3_2).

As the lower semiconductor layer AS is disposed under the first transistor T1 but is not disposed under the third transistor T3 (T3_1 and T3_2), the element characteristics of the first transistor T1 and the element characteristics of the third transistor T3 (T3_1 and T3_2) may be individually controlled. For example, the lower semiconductor layer AS may be disposed under the first transistor T1 to improve element characteristics of the first transistor T1, and the lower semiconductor layer AS may be selectively omitted under the third transistor T3 to prevent deterioration in element characteristics of the third transistor T3.

Figure 9:
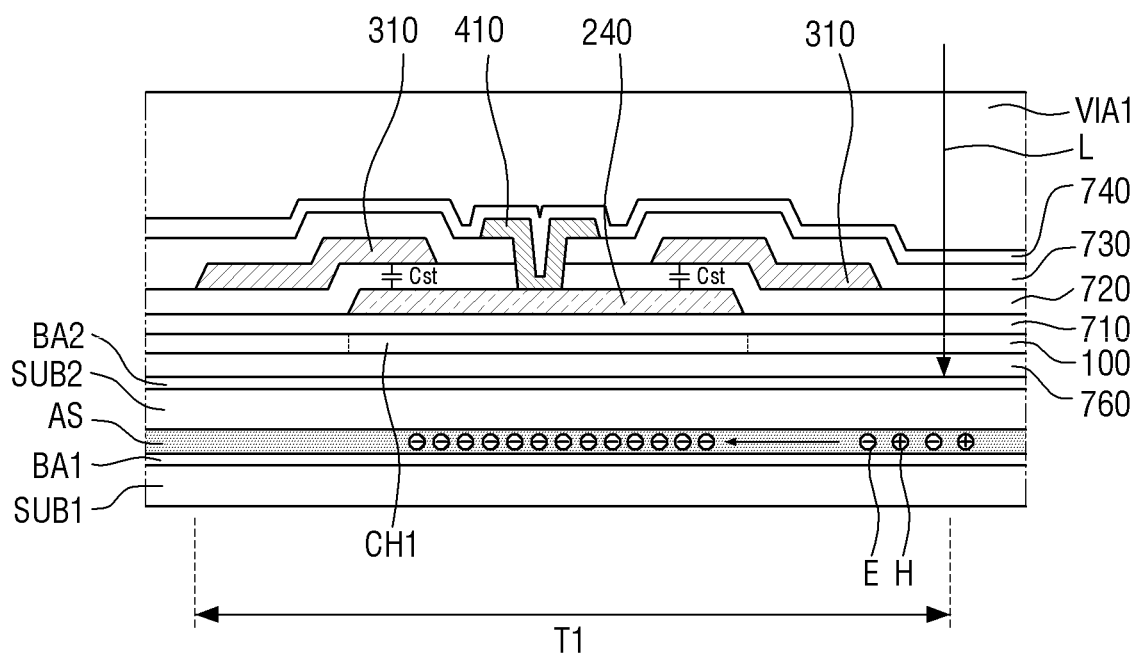
FIG. 9 is a view schematically illustrating a state in which charges formed in a lower semiconductor layer are accumulated under a first transistor.
Figure 10:
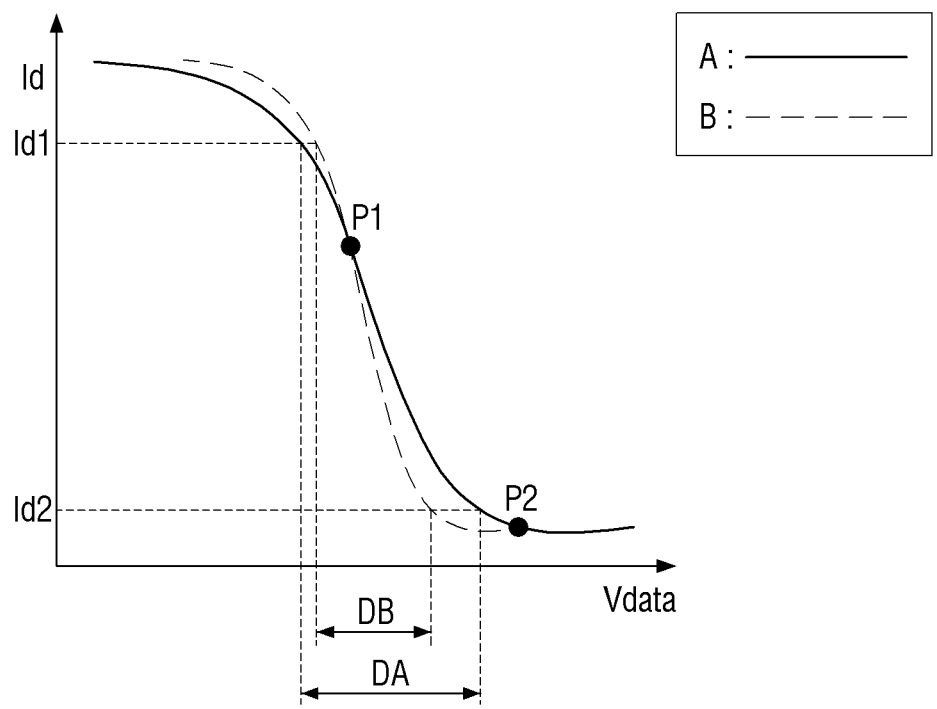
FIG. 10 is a graph of a driving current with respect to a data voltage of a first transistor according to an embodiment.
Figure 11:
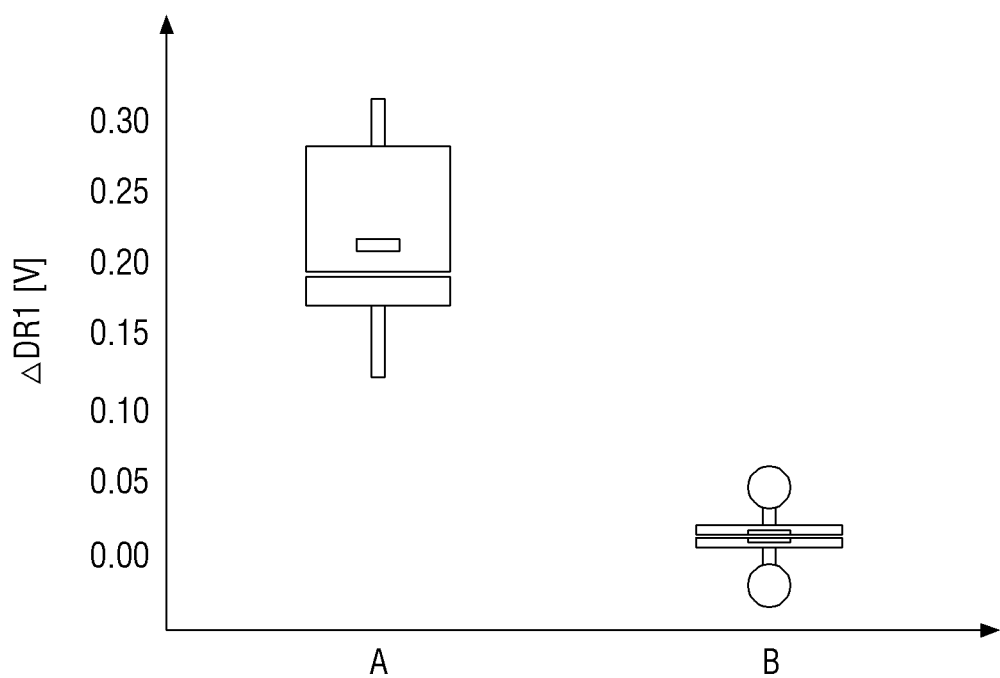
FIG. 11 is a graph of a change of a driving voltage according to whether a lower semiconductor layer is disposed under the first transistor.

FIGS. 9 to 11 are referred to for the explanation of a change in element characteristics of the first transistor T1 according to an embodiment.

FIG. 9 is a view schematically illustrating a state in which charges formed in a lower semiconductor layer are accumulated under a first transistor. FIG. 10 is a graph of a driving current with respect to a data voltage of a first transistor according to an embodiment. FIG. 11 is a graph of a change of a driving voltage according to whether a lower semiconductor layer is disposed under the first transistor. As a non-limiting example, FIG. 9 illustrates a cross-sectional view of the first transistor T1 according to an embodiment. In FIGS. 10 and 11, graph A indicates a case where the lower semiconductor layer AS is disposed under the first transistor T1, and graph B indicates a case where the lower semiconductor layer AS is not disposed under the first transistor T1.

Referring to FIG. 9, charges E and holes H are generated by light L incident on the lower semiconductor layer AS. The charges E in the lower semiconductor layer AS may move under the first transistor T1 due to a peripheral electric field. As described above, the charges E that are collected in the lower semiconductor layer AS disposed under the first transistor T1 may improve the element characteristics of the first transistor T1.

Specifically, the light L incident on the lower semiconductor layer AS may be external light incident from the outside of the display device 1 (refer to FIG. 1), or may be reflected light emitted from the display panel 10 (refer to FIG. 1) and reflected from the inside, but is not limited thereto. The light L incident on the lower semiconductor layer AS may generate the charges E and the holes H in the lower semiconductor layer AS. Among the charges E and the holes H, the charges E may move under the first transistor T1 by an electric field generated by driving the first transistor T1. Further, polarization may occur in the second substrate SUB2 that underlies the first transistor T1 by driving of the first transistor T1, and the holes H in the second substrate SUB2 may move under the channel region CH1 of the first transistor T1. Accordingly, in the lower semiconductor layer AS, the charges E may move under the channel region CH1 of the first transistor T1 and accumulate under the channel region CH1 of the first transistor T1. In FIG. 9, the first transistor T1 has been described as an example, but the description thereof may also be applied to other transistors of the pixel PX.

FIG. 10 illustrates an I-V (current-voltage) graph showing a relationship between a driving current Id and a data voltage Vdata. FIG. 10 shows two graphs including graph A where the lower semiconductor layer AS is disposed under the first transistor T1 and graph B where the lower semiconductor layer AS is not disposed under the first transistor T1. Referring to FIG. 10, graph A and graph B cross each other at the points where data voltages are P1 and P2, graph B represents a higher driving current value than graph A in the data voltage range of less than P1 or more than P2, and graph A represents a higher driving current value than graph B in the data voltage range between P1 and P2. In one embodiment, the first transistor T1 may be driven in a driving range DA between the first driving current Id1 and the second driving current Id2.

The driving range DA of the first transistor T1 is larger than a driving range DB of the first transistor T1 in the case (graph B) where the lower semiconductor layer AS is not disposed under the first transistor T1. In other words, the absolute value of the slope of graph A between the first driving current Id1 and the second driving current Id2 in the case (graph A) where the lower semiconductor layer AS is disposed under the first transistor T1 is smaller than the absolute value of the slope of graph B between the first driving current Id1 and the second driving current Id2 in the case (graph B) where the lower semiconductor layer AS is not disposed under the first transistor T1, thereby increasing the range of the data voltage Vdata capable of controlling the driving current Id for driving the light emitting element LE (refer to FIG. 3). Accordingly, the driving current Id can be more easily adjusted, and further, the luminance of the pixel PX (refer to FIG. 3) can be more easily adjusted.

Further, even when the same data voltage Vdata is applied between P1 and P2, in the case (graph A) where the lower semiconductor layer AS is disposed under the first transistor T1, a high driving current Id flow, as compared with the case (graph B) where the lower semiconductor layer AS is not disposed under the first transistor T1. Accordingly, for same data voltage Vdata being applied, the lower semiconductor layer AS that is disposed under the first transistor T1 may increase the luminance of the pixel PX (refer to FIG. 3) and improve light efficiency of the display device 1 (refer to FIG. 1).

FIG. 11 shows measurements of a change ΔDR1 of the driving range DA in the case (graph A) where the lower semiconductor layer AS is disposed under the first transistor T1 and the driving range DB in the case (graph B) where the lower semiconductor layer AS is not disposed under the first transistor T1.

In FIG. 11, the change ΔDR1 of the driving range DA (graph A) has a median value of 0.195 and an average value of 0.215. In contrast, the change ΔDR1 of the driving range DB (graph B) has a median value of 0.015 and an average value of 0.015. That is, the change ΔDR1 of the driving range DA in the case (graph A) where the lower semiconductor layer AS is disposed under the first transistor T1 may be greater than the change ΔDR1 of the driving range DB in the case (graph B) where the lower semiconductor layer AS is not disposed under the first transistor T1.

In other words, the driving range DA of the first transistor T1 may be increased by the lower semiconductor layer AS disposed under the first transistor T1, and accordingly, the driving current Id may be more easily adjusted, and the luminance of the pixel (PX, refer to FIG. 3) may be easily adjusted.

Figure 12:
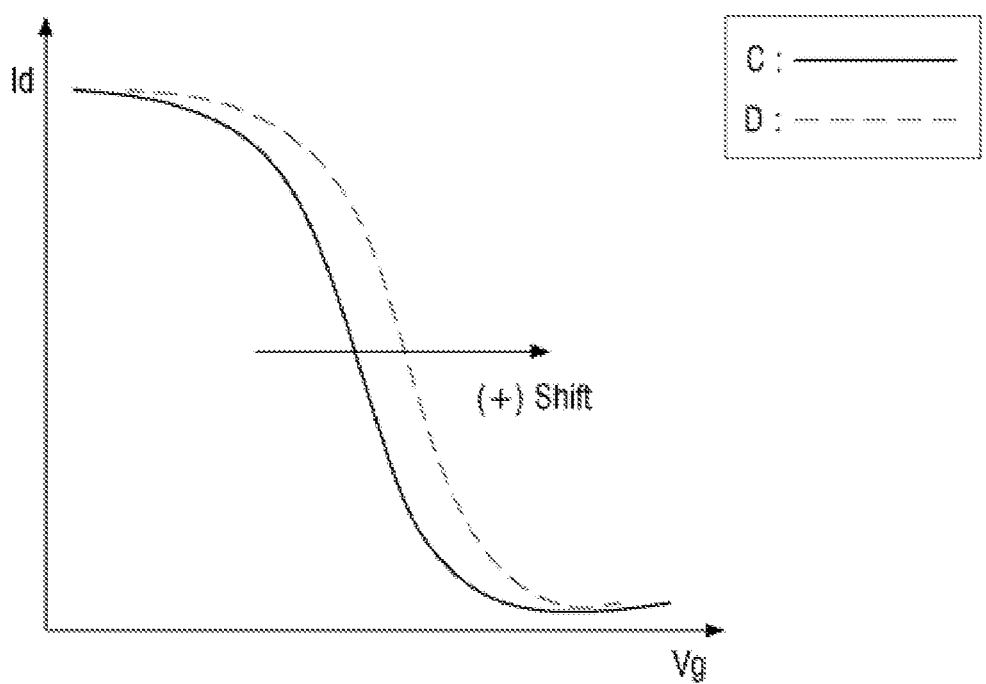
FIG. 12 is a graph of a driving current with respect to a gate voltage of a third transistor according to an embodiment.
Figure 13:
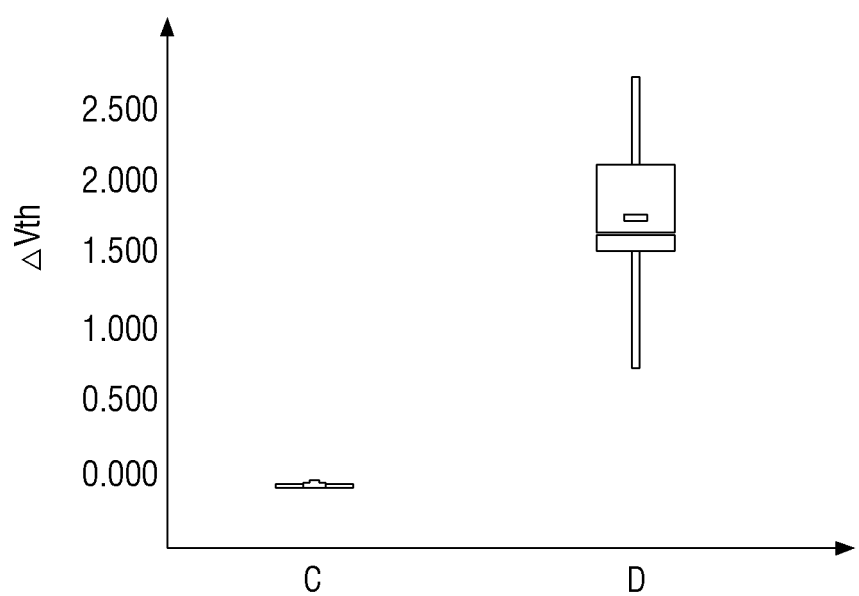
FIG. 13 is a graph of a change of a threshold voltage according to whether a lower semiconductor layer is disposed under the third transistor.

Subsequently, FIGS. 12 and 13 are referred to for the explanation of a change in element characteristics of the third transistor T3 according to an embodiment.

FIG. 12 is a graph of a driving current Id with respect to a gate voltage Vg of the third transistor T3 according to an embodiment. FIG. 13 is a graph of a change of a threshold voltage according to whether the lower semiconductor layer AS is disposed under the third transistor T3. In FIGS. 12 and 13, graph C indicates a case where a lower semiconductor layer AS is disposed under the third transistor T3, and graph D indicates a case where the lower semiconductor layer AS is not disposed under the third transistor T3.

FIG. 12 illustrates an I-V (current-voltage) graph showing a relationship between the driving current Id and the gate voltage Vg. FIG. 12 shows two graphs including graph C where the lower semiconductor layer AS is not disposed under the third transistor T3 and graph D where the lower semiconductor layer AS is not disposed under the third transistor T3.

Referring to FIG. 12, graph D is shifted (+shifted) in a positive direction from graph C. In other words, when the same gate voltage Vg is applied, the driving current Id of graph D where the lower semiconductor layer AS is disposed under the third transistor T3 is increased from graph C where the lower semiconductor layer AS is not disposed.

FIG. 13 shows measurements of a change ΔVth of the threshold voltage in the case (graph C) where the lower semiconductor layer AS is not disposed under the third transistor T3 and the case (graph D) where the lower semiconductor layer AS is disposed under the third transistor T3.

In FIG. 13, in the case (graph C) where the lower semiconductor layer AS is not disposed under the third transistor T3, the change ΔVth of the threshold voltage has a median value of 0.125 and an average value of 0.138. In contrast, in the case (graph D) where the lower semiconductor layer AS is disposed under the third transistor T3, the change ΔVth of the threshold voltage has a median value of 1.983 and an average value of 1.880. That is, the change ΔVth of the threshold voltage in the case (graph D) where the lower semiconductor layer AS is disposed under the third transistor T3 may be greater than the change ΔVth of the threshold voltage in the case (graph C) where the lower semiconductor layer AS is not disposed.

In other words, in the case (graph D) where the lower semiconductor layer AS is disposed under the third transistor T3, the threshold voltage may be shifted in a positive direction, thereby increasing a kickback of the third transistor T3. Accordingly, the luminance of the pixel PX (refer to FIG. 3) may decrease, and the light efficiency of the display device 1 (refer to FIG. 1) may decrease.

As the lower semiconductor layer AS is not disposed under the third transistor T3, it is possible to suppress or prevent the threshold voltage Vth of the third transistor T3 from being shifted in a positive direction, thereby suppressing or preventing an increase in the kickback of the third transistor T3 and a decrease in luminance of the pixel PX (refer to FIG. 3). Moreover, the display device 1 (refer to FIG. 1) may suppress or prevent a decrease in light efficiency, and improve its long-term image qualities by suppressing or preventing afterimages.

That is, the lower semiconductor layer AS that is disposed under the first transistor T1 but not under the third transistor T3 may improve the element characteristics of the first transistor T1 while preventing the deterioration of the element characteristics of the third transistor T3. Moreover, the luminance of the pixel PX (refer to FIG. 3) may be increased, and the display device 1 (refer to FIG. 1) may improve the light efficiency.

Referring back to FIGS. 4 to 8, the buffer layer 760 may be disposed on the barrier layer BA (e.g., the second barrier layer BA2). The buffer layer 760 may be disposed on the entire surface of the barrier layer BA. The buffer layer 760 may prevent diffusion of impurity ions and/or penetration of moisture or outside air, and may planarize a surface. The buffer layer 760 may include silicon nitride, silicon oxide, or silicon oxynitride. The buffer layer 760 may be omitted depending on the type or process conditions of the base substrate 750.

The active semiconductor layer 100 include a first region, a second region, and a channel (or a channel region) contacting the first and second electrodes of each of the first to seventh transistors T1 to T7. One of the first region and the second region may correspond to a source region and the other thereof may correspond to a drain region.

Hereinafter, for the convenience of reference, in a plan view, the right side may also be referred to as one side in the first direction DR1, and the left side may also be referred to as the other side in the first direction DR1 unless explicitly stated otherwise. Further, in the plan view, the upper side may also be referred to as one side in the second direction DR2, and the lower side may also be referred to as the other side in the second direction DR2 unless explicitly stated otherwise.

The active semiconductor layers 100 may extend over a plurality of pixels PX to be connected to each other without being separated from each other. The active semiconductor layer 100 may have a specific pattern in a plan view. Referring to FIG. 5, the active semiconductor layer 100 may include a first vertical portion 110, a second vertical portion 120, a third vertical portion 150, a fourth vertical portion 160, and a fifth vertical portion 170 that extend substantially in the second direction DR2; a first horizontal portion 130 and a second horizontal portion 140 that extend substantially in the first direction DR1; and first to third connection portions 181, 182, and 183 that connect some of the plurality of vertical portions 110, 120, 150, 160, and 170 and some of the plurality of horizontal portions 130 and 140. The plurality of vertical portions 110, 120, 150, 160, and 170, the plurality of horizontal portions 130 and 140, and the first to third connecting portions 181, 182, and 183 may be physically connected to each other.

The first vertical portion 110 may be disposed adjacent to the left side of the pixel PX, and the second vertical portion 120 may be disposed adjacent to the right side of the pixel PX. The first vertical portion 110 and the second vertical portion 120 may be disposed to be spaced apart from each other. The first vertical portion 110 may have a longer length in the second direction DR2 than the second vertical portion 120. The first horizontal portion 130 may connect an intermediate portion between the first vertical portion 110 and the second vertical portion 120. In the present disclosure, upper portions 111 and 121 of the first vertical portion 110 and the second vertical portion 120 may respectively refer to portions located at the upper side of a portion connected to the first horizontal portion 130 in a plan view, and lower portions 112 and 122 of the first vertical portion 110 and the second vertical portion 120 may respectively refer to portions located at the lower side of a portion connected to the first horizontal portion 130 in a plan view. The planar shapes of the first vertical portion 110, the second vertical portion 120, and the first horizontal portion 130 may be substantially similar to a 'H' shape.

The first horizontal portion 130 may connect the first vertical portion 110 and the second vertical portion 120 with a short distance, but, as shown in the drawing, may include a first bent portion 131 at the left side of the first horizontal portion 130 and a second bent portion 132 at the right side of the first horizontal portion 130. The total length of the first horizontal portion 130 may be increased by including a plurality of bent portions.

The second horizontal portion 140 may extend from one end of the upper portion 121 of the second vertical portion 120 to the left side, and may be disposed at the upper side of the first horizontal portion 130. The second horizontal portion 140 may include a region that has a larger width measured in the second direction DR2 than other regions, but the present disclosure is not limited thereto.

The third vertical portion 150, the fourth vertical portion 160, and the fifth vertical portion 170 may be disposed at the upper side of the second horizontal portion 140. The third vertical portion 150 may be disposed at the lower side of the fifth vertical portion 170, and the fourth vertical portion 160 may be disposed between the third vertical portion 150 and the fifth vertical portion 170 in the second direction DR2. One end of the fifth vertical portion 170 may be connected to the fourth vertical portion 160 via the third connection portion 183 and the other end of the fifth vertical portion 170 may be connected to the lower portion 122 of the second vertical portion 120 of an adjacent pixel PX in the second direction DR2.

The first connection portion 181 may be disposed between the second horizontal portion 140 and the third vertical portion 150. The first connection portion 181 may connect the second horizontal portion 140 and the third vertical portion 150, and may be formed to be inclined with respect to the first direction DR1 and the second direction DR2.

The second connection portion 182 may be disposed between the third vertical portion 150 and the fourth vertical portion 160 in the second direction DR2. The second connection portion 182 may connect the third vertical portion 150 and the fourth vertical portion 160.

The third connection portion 183 may be disposed between the fourth vertical portion 160 and the fifth vertical portion 170. The third connection portion 183 may connect the fourth vertical portion 160 and the fifth vertical portion 170.

The planar shapes of the third vertical portion 150, the fourth vertical portion 160, the fifth vertical portion 170, the second connecting portion 182, and the third connecting portion 183 may be substantially similar to a substantially inverted and laid down 'S' shape.

The channel of the second transistor T2 may be disposed in the upper portion 111 of the first vertical portion 110, and the channel of the fifth transistor T5 may be disposed in the lower portion 112 of the first vertical portion 110. The channel of the second sub-transistor T3_2 may be disposed in the upper portion 121 of the second vertical portion 120. The channel of the first transistor T1 may be disposed in the first horizontal portion 130. The channel of the first sub-transistor T3_1 may be disposed in the second horizontal portion 140. The channel of the third sub-transistor T4_1 may be disposed in the third vertical portion 150, and the channel of the fourth sub-transistor T4_2 may be disposed in the fourth vertical portion 160. The channel of the seventh transistor T7 may be disposed in the fifth vertical portion 170.

The active semiconductor layer 100 may include polycrystalline silicon.

Polycrystalline silicon may be formed by crystallizing amorphous silicon. Examples of the crystallization method for forming polycrystalline silicon may include, but are not limited to, rapid thermal annealing (RTA), solid phase crystallization (SPC), excimer laser annealing (ELA), metal induced crystallization (MIC), metal induced lateral crystallization (MILC), and sequential lateral solidification (SLS). As another example, the active semiconductor layer 100 may include single crystal silicon, low-temperature polycrystalline silicon, amorphous silicon, or the like, or may include an oxide semiconductor.

The first insulating layer 710 may be disposed on the active semiconductor layer 100, and may be disposed over the entire surface of the base substrate 750. The first insulating layer 710 may be referred to as a gate insulating layer.

The first insulating layer 710 may include a silicon compound, a metal oxide, or the like. For example, the first insulating layer 710 may include at least one of silicon oxide, silicon nitride, silicon oxynitride, aluminum oxide, tantalum oxide, hafnium oxide, zirconium oxide, titanium oxide, or any combination thereof.

The first conductive layer 200 is disposed on the first insulating layer 710. The first conductive layer 200 may include a first scan line 210 providing the first scan signal GW, a gate electrode 240 of the first transistor T1, a light emission control line 220 providing the light emission control signal EM, and a second scan line 230 providing the second scan signal GI.

The first scan line 210 may include a gate electrode of the second transistor T2, a gate electrode of the first sub-transistor T3_1, and a gate electrode of the second sub-transistor T3_2. The light emission control line 220 may include a gate electrode of the fifth transistor T5 and a gate electrode of the sixth transistor T6. The second scan line 230 may include a gate electrode of the third sub-transistor T4_1, a gate electrode of the fourth sub-transistor T4_2, and a gate electrode of the seventh transistor T7.

Each of the first scan line 210, the light emission control line 220, and the second scan line 230 may extend along the first direction DR1 to a neighboring pixel PX beyond a boundary of the pixel PX.

The first scan line 210 may be located around the center of the pixel PX, and may overlap the upper portion 111 of the first vertical portion 110 of the active semiconductor layer 100 and the upper portion 121 of the second vertical portion 120 of the active semiconductor layer 100.

The first scan line 210 may include the gate electrode of the second transistor T2 at a portion overlapping the upper portion 111 of the first vertical portion 110 of the active semiconductor layer 100. The first vertical portion 110 of the active semiconductor layer 100 located at the upper side of the overlapping portion may correspond to a first region of the second transistor T2, and the first vertical portion 110 of the active semiconductor layer 100 located at the lower side of the overlapping portion may correspond to a second region of the second transistor T2.

The first scan line 210 may include the gate electrode of the second sub-transistor T3_2 at a portion overlapping the upper portion 121 of the second vertical portion 120 of the active semiconductor layer 100. The second vertical portion 120 of the active semiconductor layer 100 located at the upper side of the overlapping portion may correspond to a second region of the second sub-transistor T3_2, and the second vertical portion 120 of the active semiconductor layer 100 located at the lower side of the overlapping portion may correspond to a first region of the second sub-transistor T3_2.

The first scan line 210 may further include a first scan line protrusion portion 211. The first scan line protrusion portion 211 may protrude from the first scan line 210 extending in the first direction DR1 toward the upper side thereof.

The first scan line protrusion portion 211 may overlap the second horizontal portion 140 of the active semiconductor layer 100, and may include the gate electrode of the first sub-transistor T3_1 at the corresponding overlapping portion. The second horizontal portion 140 of the active semiconductor layer 100 located at the right side of the overlapping portion may correspond to a first region of the first sub-transistor T3_1, and the second horizontal portion 140 of the active semiconductor layer 100 located at the left side of the overlapping portion may correspond to a second region of the first sub-transistor T3_1.

The light emission control line 220 may be located at the lower side of the pixel PX in a plan view, and may overlap the lower portion 112 of the first vertical portion 110 of the active semiconductor layer 100 and the lower portion 122 of the second vertical portion 120 of the active semiconductor layer 100.

The light emission control line 220 may include the gate electrode of the fifth transistor T5 at a portion overlapping the lower portion 112 of the first vertical portion 110 of the active semiconductor layer 100. The first vertical portion 110 of the active semiconductor layer 100 located at the upper side of the overlapping portion may correspond to a second region of the fifth transistor T5, and the first vertical portion 110 of the active semiconductor layer 100 located at the lower side of the overlapping portion may correspond to a first region of the fifth transistor T5.

The light emission control line 220 may include the gate electrode of the sixth transistor T6 at a portion overlapping the lower portion 122 of the second vertical portion 120 of the active semiconductor layer 100. The second vertical portion 120 of the active semiconductor layer 100 located at the upper side of the overlapping portion may correspond to a first region of the sixth transistor T6, and the second vertical portion 120 of the active semiconductor layer 100 located at the lower side of the overlapping portion may correspond to a second region of the sixth transistor T6.

The second scan line 230 may be located at the upper side of the pixel PX in a plan view, and may overlap the third vertical portion 150, the fourth vertical portion 160, and the fifth vertical portion 170 of the active semiconductor layer 100.

The second scan line 230 may include the gate electrode of the third sub-transistor T4_1 at a portion overlapping the third vertical portion 150 of the active semiconductor layer 100. The third vertical portion 150 of the active semiconductor layer 100 located at the upper side of the overlapping portion may correspond to a second region of the third sub-transistor T4_1, and the third vertical portion 150 of the active semiconductor layer 100 located at the lower side of the overlapping portion may correspond to a first region of the third sub-transistor T4_1.

The second scan line 230 may include the gate electrode of the fourth sub-transistor T4_2 at a portion overlapping the fourth vertical portion 160 of the active semiconductor layer 100. The fourth vertical portion 160 of the active semiconductor layer 100 located at the upper side of the overlapping portion may correspond to a first region of the fourth sub-transistor T4_2, and the fourth vertical portion 160 of the active semiconductor layer 100 located at the lower side of the overlapping portion may correspond to a second region of the fourth sub-transistor T4_2.

The second scan line 230 may include the gate electrode of the seventh transistor T7 at a portion overlapping the fifth vertical portion 170 of the active semiconductor layer 100. The fifth vertical portion 170 of the active semiconductor layer 100 located at the upper side of the overlapping portion may correspond to a second region of the seventh transistor T7, and the fifth vertical portion 170 of the active semiconductor layer 100 located at the lower side of the overlapping portion may correspond to a first region of the seventh transistor T7.

The gate electrodes of the second to seventh transistors T2 to T7 may have a width greater than that of the peripheral line at the corresponding portion, but the present disclosure is not limited thereto.

The gate electrode 240 of the first transistor T1 may be located at the center of the pixel PX. The gate electrode 240 of the first transistor T1 may be located between the first scan line 210 and the light emission control line 220 in a plan view. The gate electrode 240 of the first transistor T1 for each pixel PX may be separated from each other.

The gate electrode 240 of the first transistor T1 may overlap the first horizontal portion 130 of the active semiconductor layer 100. The first horizontal portion 130 of the active semiconductor layer 100 located at the left side of the overlapping portion may correspond to a first region of the first transistor T1, and the first horizontal portion 130 of the active semiconductor layer 100 located at the right side of the overlapping portion may correspond to a second region of the first transistor T1.

The first conductive layer 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 720 may insulate the first conductive layer 200 and the second conductive layer 300 from each other. The second insulating layer 720 may be disposed on the first conductive layer 200, and may be disposed over the entire surface of the base substrate 750. The second insulating layer 720 may be an interlayer insulating layer.

The second insulating layer 720 may include an inorganic insulating material such as silicon oxide, silicon nitride, silicon oxynitride, hafnium oxide, aluminum oxide, titanium oxide, tantalum oxide, or zinc oxide, or may include an organic insulating material such as acrylic resin (e.g., polyacrylate resin), epoxy resin, phenolic resin, polyamide resin, polyimide resin, unsaturated polyester resin, poly polyphenylene resin (e.g., polyphenylene ether resin), polyphenylene sulfide resin, or benzocyclobutene (BCB). The second insulating layer 720 may be a single layer or multiple layers including laminated layers of different materials.

The second conductive layer 300 is disposed on the second insulating layer 720. The second conductive layer 300 may include a capacitor electrode line 310, an initialization voltage line 320 providing the initialization voltage VINT, and the light blocking pattern 330.

Each of the capacitor electrode line 310 and the initialization voltage line 320 may extend along the first direction DR1 to a neighboring pixel PX beyond a boundary of the pixel PX. The light blocking pattern 330 may have an island shape. Each light blocking pattern 330 may be disposed across two pixels PX adjacent to each other in the first direction DR1, but the present disclosure is not limited thereto.

The capacitor electrode line 310 may cross the center of the pixel PX, and may be disposed to overlap the gate electrode 240 of the underlying first transistor T1 with the second insulating layer 720 interposed therebetween to form the capacitor Cst. The gate electrode 240 of the first transistor T1 may correspond to the first electrode of the capacitor Cst, an enlarged area of the capacitor electrode line 310 overlapping the first transistor T1 may correspond to the second electrode of the capacitor Cst, and the second insulating layer 720 interposed therebetween may correspond to a dielectric of the capacitor Cst.

The width of the capacitor electrode line 310 may be enlarged in an area overlapping the gate electrode 240 of the first transistor T1. The capacitor electrode line 310 may include an opening that overlaps the gate electrode 240 of the underlying first transistor T1 in the enlarged area.

The initialization voltage line 320 may be located at the upper side of the pixel PX in a plan view. The initialization voltage line 320 may overlap the fifth vertical portion 170 of the active semiconductor layer 100.

At least a part of the light blocking pattern 330 may be disposed between the channel regions CH3_1 and CH3_2 of the third transistor T3 (T3_1 and T3_2) to overlap a connection area CA that connects the channel regions CH3_1 and CH3_2 in the thickness direction. The light blocking pattern 330 may block the connection area CA from a data line 450 that provides the data signal DATA and suppress or prevent the third transistor T3 from being influenced by the data signal DATA. For example, the light blocking pattern 330 may suppress or prevent the current passing through the third transistor T3 and/or the gate voltage applied to the first transistor T1 from being changed according to a change of the data signal DATA, and thus reliability of the pixel PX may be improved.

The light blocking pattern 330 may be electrically connected to the first scan line 210 by a connection pattern 460. Accordingly, the light blocking pattern 330 may be applied with substantially the same voltage as the first scan line 210 and the first scan line protrusion portion 211 as the gate electrode of the third transistor T3 (T3_1 and T3_2), and thus element characteristics of the third transistor T3 (T3_1 and T3_2) may be improved. Details thereof will be described later.

The second conductive layer 300 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 730 may cover the second conductive layer 300. The third insulating layer 730 may be disposed over the entire surface of the base substrate 750. The third insulating layer 730 may be an interlayer insulating layer. The third insulating layer 730 may include the same material as the second insulating layer 720, or may include at least one material constituting the second insulating layer 720.

The third conductive layer 400 is disposed on the third insulating layer 730. The third conductive layer 400 may include a plurality of data patterns including a first data pattern 410 and a second data pattern 420, a first anode connection electrode 430 for electrically connecting the anode electrode ANO of the light emitting element LE to the active semiconductor layer 100, a first power voltage line 440 providing the first power voltage ELVDD, the data line 450 for providing the data signal DATA, and the connection pattern 460.

The third conductive layer 400 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The third conductive layer 400 may be a single layer or multiple layers. For example, the third conductive layer 400 may have a laminated structure of Ti/Al/Ti, Mo/Al/Mo, Mo/AlGe/Mo, and Ti/Cu.

Each of the first and second data patterns 410 and 420 may have a shape extending in the second direction DR2, and the length of each of the first and second data patterns 410 and 420 in the second direction DR2 may be smaller than the length of the pixel PX in the second direction DR2. The first and second data patterns 410 and 420 may be physically spaced apart from each other. Each of the first and second data patterns 410 and 420 may electrically connect portions that are separated from each other.

Referring to FIG. 7, the first data pattern 410 may overlap the gate electrode 240 of the first transistor T1. In the overlapping area, the first data pattern 410 may be electrically connected to the gate electrode 240 of the first transistor T1 through a first contact hole CNT1 that penetrates through the third insulating layer 730 and the second insulating layer 720 to expose the gate electrode 240 of the first transistor T1. The first contact hole CNT1 may be located in the opening of the capacitor electrode line 310. The first data pattern 410 inside the first contact hole CNT1 and the capacitor electrode line 310 adjacent thereto may be insulated from each other by the third insulating layer 730.

Further, the first data pattern 410 may extend upward in a plan view from an overlapping area with the gate electrode 240 of the first transistor T1 to insulate and intersect the first scan line 210, and may overlap a part of the second horizontal portion 140 of the active semiconductor layer 100. In the overlapping area, the first data pattern 410 may be electrically connected to the second horizontal portion 140 of the active semiconductor layer 100 through a second contact hole CNT2 that penetrates through the third insulating layer 730, the second insulating layer 720, and the first insulating layer 710 to expose a part of the second horizontal portion 140 of the active semiconductor layer 100. A part of the second horizontal portion 140 may correspond to the second region of the first sub-transistor T3_1, but the present disclosure is not limited thereto.

In other words, the first data pattern 410 may electrically connect the gate electrode 240 of the first transistor T1 and the second horizontal portion 140 of the active semiconductor layer 100.

The second data pattern 420 may overlap the third connection portion 183 of the active semiconductor layer 100. In the overlapping area, the second data pattern 420 may be electrically connected to the third connection portion 183 of the active semiconductor layer 100 through a fourth contact hole CNT4 that penetrates through the third insulating layer 730, the second insulating layer 720, and the first insulating layer 710 to expose the third connection portion 183 of the active semiconductor layer 100.

Further, the second data pattern 420 may extend upward in a plan view from an overlapping area with the third connection portion 183 of the active semiconductor layer 100 to insulate and intersect the second scan line 230, and may overlap the initialization voltage line 320. In the overlapping area, the second data pattern 420 may be electrically connected to the initialization voltage line 320 through a fifth contact hole CNT5 that penetrates through the third insulating layer 730 to expose the initialization voltage line 320.

In other words, the second data pattern 420 may electrically connect the third connection portion 183 of the active semiconductor layer 100 to the initialization voltage line 320.

The first anode connection electrode 430 may have a shape extending in the second direction DR2, but the length of the first anode connection electrode 430 in the second direction DR2 may be smaller than the length of the pixel PX in the second direction DR2. The first anode connection electrode 430 may be physically spaced apart from the first and second data patterns 410 and 420. The first anode connection electrode 430 may connect the active semiconductor layer 100 to the anode electrode ANO together with a second anode connection electrode 530 to be described later.

The first anode connection electrode 430 may overlap the lower portion 122 of the second vertical portion 120 of the active semiconductor layer 100. The first anode connection electrode 430 may be electrically connected to the lower portion 122 of the second vertical portion 120 of the active semiconductor layer 100 through a sixth contact hole CNT6 that penetrates through the third insulating layer 730, the second insulating layer 720, and the first insulating layer 710 to expose the lower portion 122 of the second vertical portion 120 of the active semiconductor layer 100.

The first power voltage line 440 may extend along the second direction DR2 to a neighboring pixel PX beyond a boundary of the pixel PX along the second direction DR2. The first power voltage line 440 may extend to be substantially adjacent to the left side of the pixel PX, but may be disposed at one side of the data line 450 in the first direction DR1, but the present disclosure is not limited thereto. The first power voltage line 440 may be electrically connected to the capacitor electrode line 310 through an eighth contact hole CNT8 that penetrates through the third insulating layer 730 to expose the capacitor electrode line 310.

Further, the first power voltage line 440 may be electrically connected to the lower portion 112 of the first vertical portion 110 of the active semiconductor layer 100 through a seventh contact hole CNT7 that penetrates through the third insulating layer 730, the second insulating layer 720, and the first insulating layer 710 to expose the lower portion 112 of the first vertical portion 110 of the active semiconductor layer 100.

The data line 450 may extend along the second direction DR2 to a neighboring pixel PX beyond a boundary of the pixel PX. The data line 450 may be disposed adjacent to the left side of the pixel PX. The data line 450 may overlap the first vertical portion 110 of the active semiconductor layer 100.

The data line 450 may be electrically connected to the upper portion 111 of the first vertical portion 110 of the active semiconductor layer 100 through a third contact hole CNT3 that penetrates through the third insulating layer 730, the second insulating layer 720, and the first insulating layer 710 to expose the upper portion 111 of the first vertical portion 110 of the active semiconductor layer 100. The third contact hole CNT3 may be located under the second scan line 230 in a plan view, but the present disclosure is not limited thereto.

The connection pattern 460 may be disposed between the first power voltage line 440 and the data line 450, and may have a shape extending in the second direction DR2. The length of the connection pattern 460 in the second direction DR2 may be smaller than the length of the pixel PX in the second direction DR2. The connection pattern 460 may be physically spaced apart from the first and second data patterns 410 and 420. The connection pattern 460 may electrically connect portions that are separated from each other.

At least a part of the connection pattern 460 may overlap the first scan line 210. In the overlapping area, the connection pattern 460 may be electrically connected to the first scan line 210 through a ninth contact hole CNT9 that penetrates through the third insulating layer 730 and the second insulating layer 720 to expose the first scan line 210.

Further, the connection pattern 460 may extend upward in a plan view from an area overlapping the first scan line 210 to overlap a part of the light blocking pattern 330. In the overlapping area, the connection pattern 460 may be electrically connected to the light blocking pattern 330 through a tenth contact hole CNT10 that penetrates through the third insulating layer 730 to expose the light blocking pattern 330.

In other words, the connection pattern 460 may electrically connect the first scan line 210 and the light blocking pattern 330. Accordingly, the light blocking pattern 330 may be applied with substantially the same voltage as the first scan line 210 and the first scan line protrusion portion 211 as the gate electrode of the third transistor T3 (T3_1 and T3_2), and thus element characteristics of the third transistor T3 (T3_1 and T3_2) may be improved.

Figure 14:
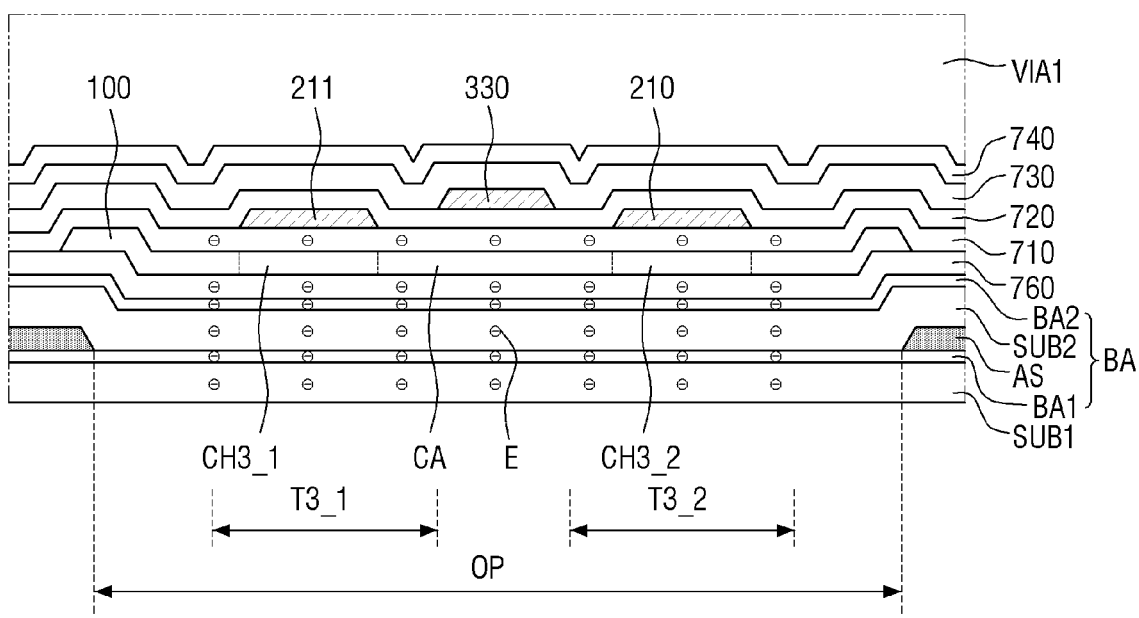
FIG. 14 is a cross-sectional view illustrating an arrangement of charges located around the third transistor.
Figure 15:
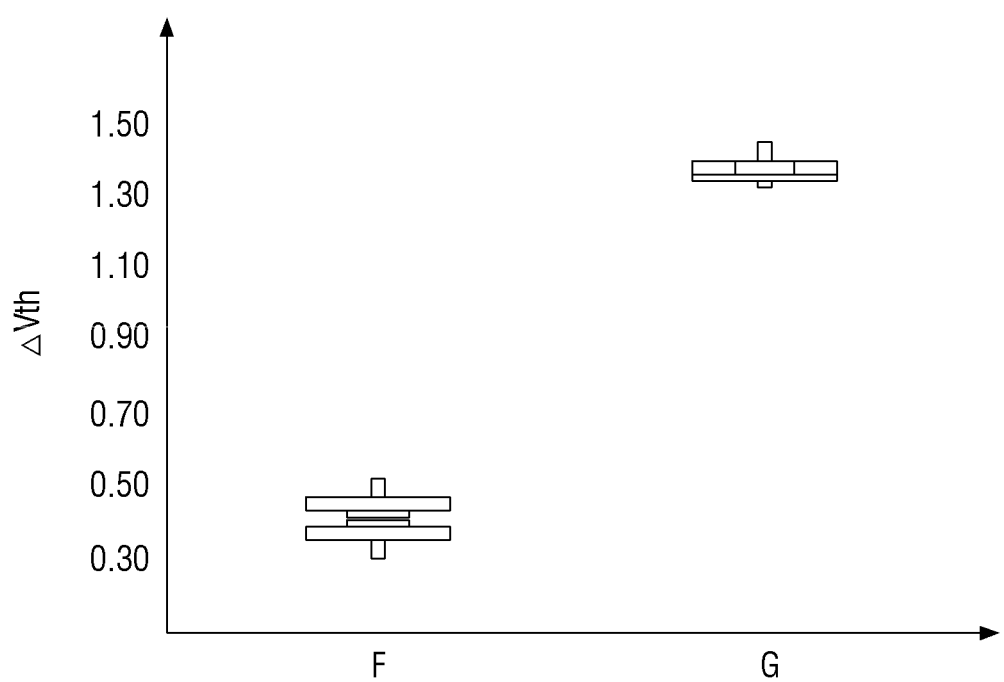
FIG. 15 is a graph of a change of a threshold voltage with respect to a voltage applied to a light blocking pattern.

FIG. 14 is a cross-sectional view illustrating an arrangement of charges located around the third transistor T3. FIG. 15 is a graph of a change of a threshold voltage with respect to a voltage applied to the light blocking pattern 330.

In FIG. 15, graph F indicates a case where the voltage applied to the light blocking pattern 330 and the voltage applied to the gate electrode of the third transistor T3 (T3_1 and T3_2) are substantially the same as each other, and graph G indicates a case where the voltage applied to the light blocking pattern 330 and the voltage applied to the gate electrode of the third transistor T3 (T3_1 and T3_2) are different from each other. For example, graph F may indicate a case where the first scan signal GW is applied to the light blocking pattern 330, and graph G may indicate a case where the first power supply voltage ELVDD is applied to the light blocking pattern 330, but the present disclosure is not limited thereto.

First, referring to FIG. 14, when the voltage applied to the light blocking pattern 330 and the voltage applied to the gate electrode of the third transistor T3 (T3_1 and T3_2) are substantially the same as each other, charges E in the insulating layer (e.g., the first insulating layer 710) around the active layer (e.g., the active semiconductor layer 100) of the third transistor T3 (T3_1 and T3_2) may be substantially uniformly distributed. In other words, when the light blocking pattern 330 is electrically connected to the first scan line 210, the first scan signal GW may be equally applied to the gate electrode of the third transistor T3 (T3_1 and T3_2) and the light blocking pattern 330.

When substantially the same voltage is applied to the gate electrode of the third transistor T3 (T3_1 and T3_2) and the light blocking pattern 330, charges E in the first insulating layer 710, the buffer layer 760, the barrier layer BA, and the first and second substrates SUB1 and SUB2 that are arranged under the gate electrode of the third transistor T3 (T3_1 and T3_2) and the light blocking pattern 330 may be substantially uniformly distributed. In an area overlapping the active layer of the third transistor T3 (T3_1 and T3_2), the charges E may be distributed substantially uniformly. That is, the charges E may not be intensively accumulated in a part of the active layer of the third transistor T3 (T3_1 and T3_2) so that element characteristics of the third transistor T3 (T3_1 and T3_2) may not be influenced, and deterioration in the element characteristics of the third transistor T3 (T3_1 and T3_2) may be suppressed or prevented. As a result, the element characteristics of the third transistor T3 (T3_1 and T3_2) may be improved.

Referring to FIG. 15, in the case (graph F) where the voltage applied to the light blocking pattern 330 and the voltage applied to the gate electrode of the third transistor T3 (T3_1 and T3_2) are substantially the same as each other, a change ΔVth of the threshold voltage may be small as compared with the case (graph G) where the voltage applied to the light blocking pattern 330 and the voltage applied to the gate electrode of the third transistor T3 (T3_1 and T3_2) are different from each other. Accordingly, when the voltage applied to the light blocking pattern 330 is substantially the same as the voltage applied to the gate electrode of the third transistor T3 (T3_1 and T3_2), it is possible to suppress or prevent the threshold voltage Vth from being shifted in a positive direction suppressing or preventing an increase in kickback of the third transistor T3 (T3_1 and T3_2) and a decrease in luminance of the pixel PX. Moreover, the display device 1 (refer to FIG. 1) may improve light efficiency and its long-term image quality characteristics by suppressing or preventing afterimages.

Although FIGS. 14 and 15 illustrate a case where the lower semiconductor layer AS is selectively removed under the third transistor T3 (T3_1 and T3_2), the present disclosure is not limited thereto. For example, even if the lower semiconductor layer AS is disposed under the third transistor T3 (T3_1 and T3_2), the voltage applied to the light blocking pattern 330 and the voltage applied to the gate electrode of the third transistor T3 (T3_1 and T3_2) may be substantially the same as each other so that the charges E in the lower semiconductor layer AS (e.g., charges E generated by external light L) may be distributed substantially uniformly without being accumulated under the channel regions CH3_1 and CH3_2 of the third transistor T3 (T3_1 and T3_2). Accordingly, shifting of the threshold voltage Vth in the positive direction by the lower semiconductor layer AS disposed under the third transistor T3 (T3_1 and T3_2) may be suppressed or prevented even if the lower semiconductor layer AS may be disposed under the third transistor T3 (T3_1 and T3_2).

Referring back to FIGS. 4 to 8, the protective layer 740 may be disposed on the third conductive layer 400. The protective layer 740 may include an inorganic layer, for example, a silicon nitride layer, a silicon oxynitride layer, a silicon oxide layer, a titanium oxide layer, or an aluminum oxide layer. However, in some embodiments, the protective layer 740 may be omitted.

The first via layer VIA1 may be disposed on the protective layer 740. The first via layer VIA1 may serve as a planarization layer. The first via layer VIA1 may include an inorganic insulating material, or may be include an organic insulating material such as acrylic resin (e.g., polyacrylate resin), epoxy resin, phenolic resin, polyamide resin, polyimide resin, unsaturated polyester resin, poly polyphenylene resin (e.g., polyphenylene ether resin), polyphenylene sulfide resin, or benzocyclobutene (BCB).

The fourth conductive layer 500 is disposed on the first via layer VIAL The fourth conductive layer 500 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fourth conductive layer 500 may include the second anode connection electrode 530. A first anode contact hole ACNT1 exposing the first anode connection electrode 430 may be disposed in the first via layer VIA1, and the second anode connection electrode 530 may be connected to the first anode connection electrode 430 through the first anode contact hole ACNT1.

The second via layer VIA2 may be disposed on the fourth conductive layer 500. The second via layer VIA2 may also serve as a planarization layer. The second via layer VIA2 may include an inorganic insulating material, or may be include an organic insulating material such as acrylic resin (e.g., polyacrylate resin), epoxy resin, phenolic resin, polyamide resin, polyimide resin, unsaturated polyester resin, poly polyphenylene resin (e.g., polyphenylene ether resin), polyphenylene sulfide resin, or benzocyclobutene (BCB).

The fifth conductive layer 600 may be disposed on the second via layer VIA2. The fifth conductive layer 600 may include the anode electrode ANO. The anode electrode ANO may be separately disposed for each pixel PX. The anode electrode ANO may be electrically connected to the second anode connection electrode 530 through a second anode contact hole ACNT2 that penetrates through the second via layer VIA2 to expose the second anode connection electrode 530.

The anode electrode ANO may have, but is not limited to, a laminated film structure in which a high-work-function material layer including Indium-Tin-Oxide (ITO), Indium-Zinc-Oxide (IZO), Zinc Oxide (ZnO), or Indium Oxide (In$_2$O$_3$) and a reflective material layer including silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are laminated. The high-work-function material layer may be disposed over the reflective material layer to be closer to the light emitting layer EL. The anode electrode ANO may have a multi-layer structure of ITO/Mg, ITO/MgF, ITO/Ag, or ITO/Ag/ITO, but the present disclosure is not limited thereto.

The pixel defining layer PDL may be disposed on the fifth conductive layer 600 and the second via layer VIA2. The pixel defining layer PDL may include an opening that partially exposes the anode electrode ANO. The pixel defining layer PDL may include an organic insulating material or an inorganic insulating material. For example, the pixel defining layer PDL may include at least one of polyimide resin, acrylic resin, a silicon compound, and polyacrylic resin.

The light emitting layer EL may be further disposed on the anode electrode ANO exposed by the pixel defining layer PDL. The light emitting layer EL may include an organic material layer. The organic material layer of the light emitting layer EL may include an organic light emitting layer, and may further include a hole injection/transport layer and/or an electron injection/transport layer.

The cathode electrode CAT may be disposed on the light emitting layer EL. The cathode electrode CAT may be a common electrode that is entirely disposed on the base substrate 750. The anode electrode ANO, the light emitting layer EL, and the cathode electrode CAT may constitute an organic light emitting element of the pixel PX.

The cathode electrode CAT may include a low-work-function material layer including Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). The cathode electrode CAT may further include a transparent metal oxide layer disposed on the low-work-function material layer.

A thin film encapsulation layer 770 may be disposed on the cathode electrode CAT. The thin film encapsulation layer 770 may include a first inorganic layer 771, a first organic layer 772, and a second inorganic layer 773. At the edges of the thin film encapsulation layer 770, the first inorganic layer 771 and the second inorganic layer 773 may contact each other. The first organic layer 772 may be encapsulated by the first inorganic layer 771 and the second inorganic layer 773.

Each of the first inorganic layer 771 and the second inorganic layer 773 may each include silicon nitride, silicon oxide, or silicon oxynitride. The first organic layer 772 may include an organic insulating material.

Hereinafter, other embodiments will be described. In the following embodiments, redundant descriptions for the same components and configurations as those previously described will be omitted or simplified, and differences will be mainly described.

Figure 16:
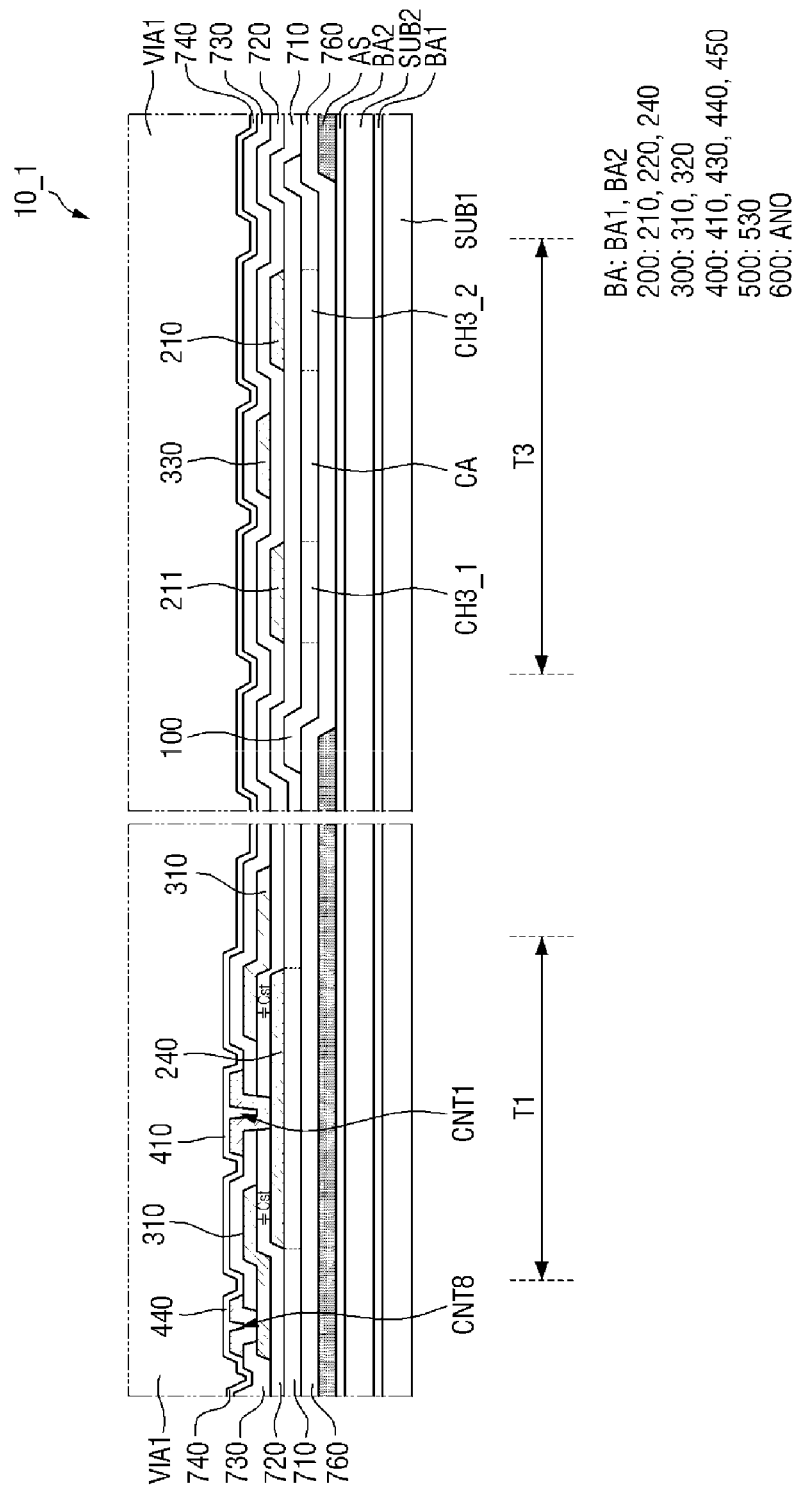
FIG. 16 is a cross-sectional view of a display panel according to another embodiment.

FIG. 16 is a cross-sectional view of a display panel according to another embodiment. FIG. 16 illustrates a partial cross-sectional view of a peripheral area of the first transistor T1 and the third transistor T3.

Referring to FIG. 16, a display panel 10_1 is different from the display panel 10 that is described with reference to FIG. 7 in that the lower semiconductor layer AS of the display panel 10_1 may be disposed between the barrier layer BA and the buffer layer 760.

Specifically, the lower semiconductor layer AS according to the present embodiment may be disposed between the base substrate 750 and the buffer layer 760. The lower semiconductor layer AS may be disposed on the first substrate SUB1 and the second substrate SUB2, and may be disposed under the buffer layer 760. In this case, the thickness of the lower semiconductor layer AS may be, but is not limited to, for example, in the range of 20 nm to 50 nm or in the range of 5 nm to 100 nm. When the lower semiconductor layer AS is disposed on the first substrate SUB1 and the second substrate SUB2 and under the buffer layer 760, and the thickness thereof is within the above range, in the process of crystallizing the active semiconductor layer 100, disconnection may be prevented, and recognition failure of alignment marks may be prevented.

The lower semiconductor layer AS may be disposed under the first transistor T1 and may not be disposed under the third transistor T3, thereby individually controlling the element characteristics of the first transistor T1 and the third transistor T3. Further, the light blocking pattern 330 (refer to FIG. 8) may be applied with substantially the same voltage as the gate electrode of the third transistor T3 (T3_1 and T3_2), and thus element characteristics of the third transistor T3 (T3_1 and T3_2) may be improved. Furthermore, the lower semiconductor layer AS may be disposed closer to the active layer of the first transistor T1, and the thickness thereof may be increased, thereby more improving the element characteristics of the first transistor T1.

Figure 17:
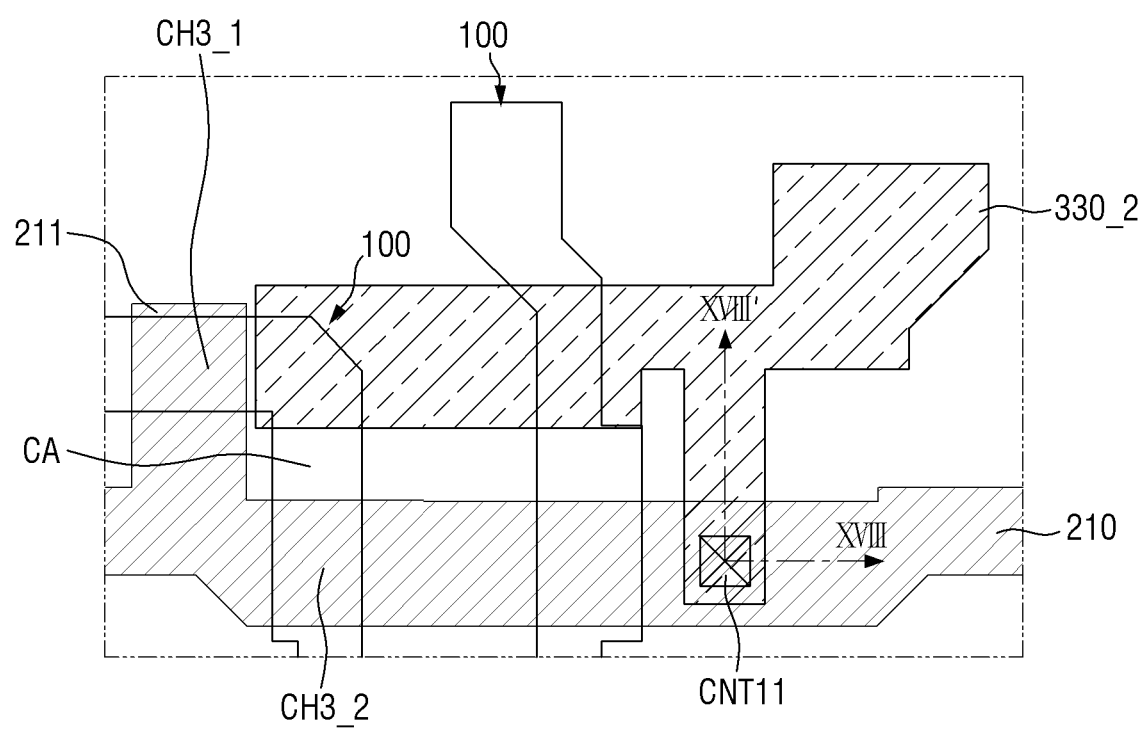
FIG. 17 is an enlarged view of a periphery of a light blocking pattern according to another embodiment.
Figure 18:
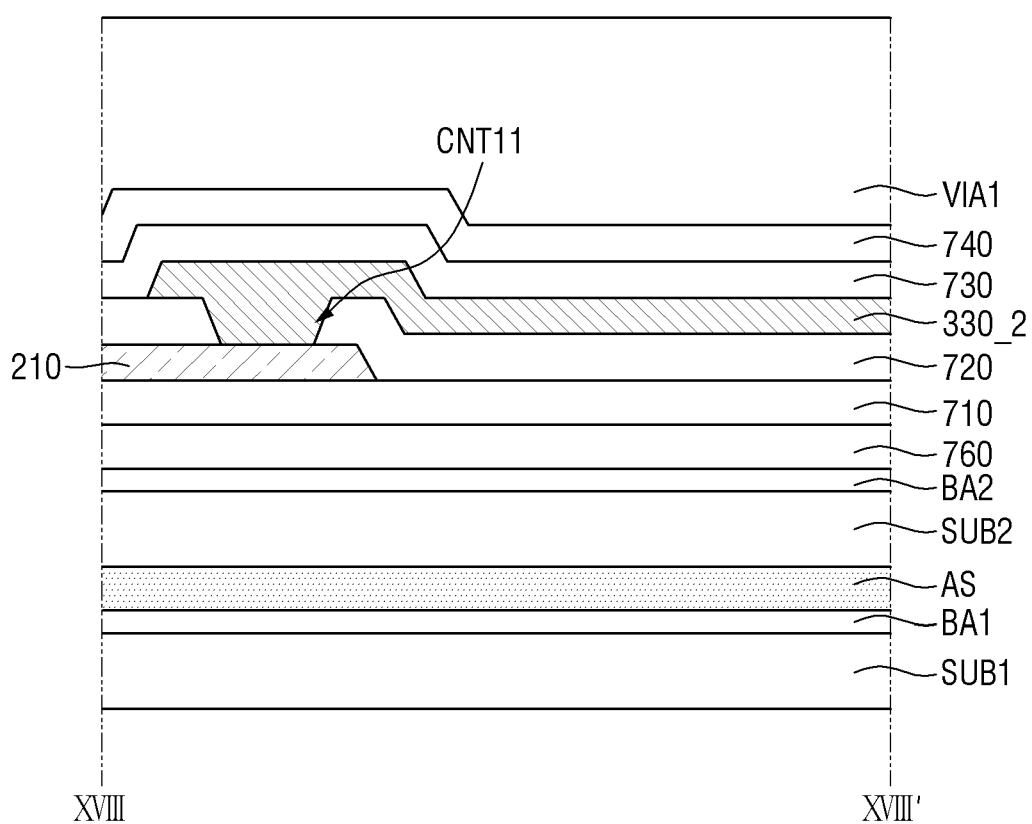
FIG. 18 is a cross-sectional view taken along the line XVIII-XVIII' in FIG. 17.

FIG. 17 is a layout view of a periphery of a light blocking pattern according to another embodiment. FIG. 18 is a cross-sectional view taken along the line XVIII-XVIII' in FIG. 17. For convenience of explanation, FIG. 17 illustrates only a light blocking pattern 330_2, the active semiconductor layer 100, and the first scan line 210 according to the present embodiment.

Referring to FIGS. 17 and 18, the present embodiment is different from the embodiment described with reference to FIG. 6 in that the light blocking pattern 330_2 may directly contact the first scan line 210 through an eleventh contact hole CNT11.

Specifically, the light blocking pattern 330_2 may overlap the first scan line 210. In the overlapping area, the light blocking pattern 330_2 may be electrically connected to the first scan line 210 through the eleventh contact hole CNT11 that penetrates through the second insulating layer 720 to expose a part of the first scan line 210. In this case, the connection pattern 460 (refer to FIG. 6) may be omitted.

The lower semiconductor layer AS may be disposed under the first transistor T1 and may not be disposed under the third transistor T3, thereby individually controlling the element characteristics of the first transistor T1 and the third transistor T3. Further, the light blocking pattern 330 (refer to FIG. 8) may be applied with substantially the same voltage as the gate electrode of the third transistor T3 (T3_1 and T3_2), and thus element characteristics of the third transistor T3 (T3_1 and T3_2) may be improved. Furthermore, the light blocking pattern 330_2 may directly contact the first scan line 210 without an additional conductive pattern, so that contact resistance may be reduced, and an electrical signal may be transmitted therethrough more easily.

Figure 19:
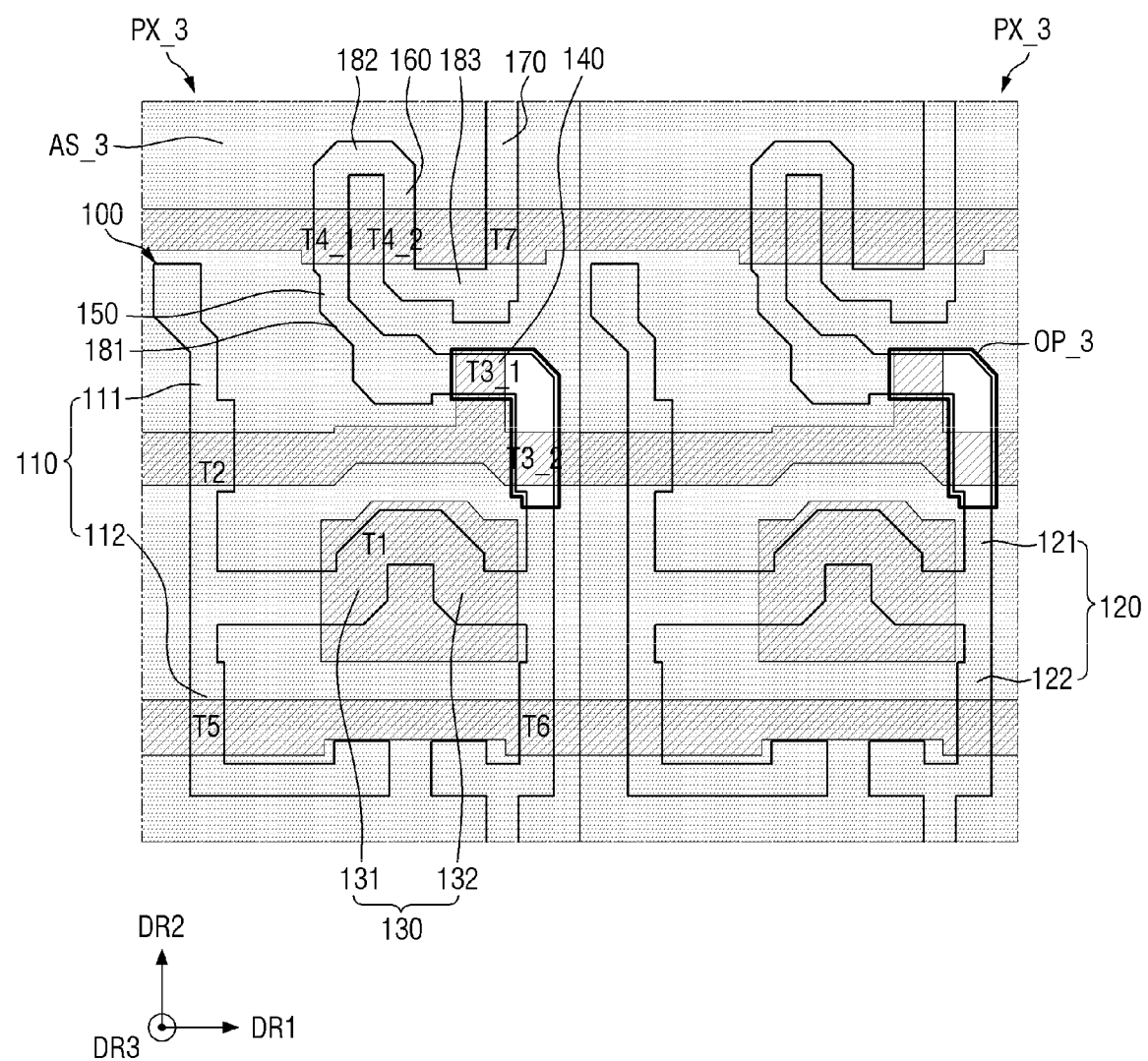
FIG. 19 is a layout view of a lower semiconductor layer, a semiconductor layer, and a first conductive layer of a pixel according to another embodiment.

FIG. 19 is a layout view of a lower semiconductor layer, a semiconductor layer, and a first conductive layer of a pixel according to another embodiment.

Referring to FIG. 19, the present embodiment is different from the embodiment described with reference to FIG. 5 in that, in the area overlapping the active semiconductor layer 100, a pixel PX_3 may have an opening OP_3 in a lower semiconductor layer AS_3, and the opening OP_3 may have the substantially same pattern as the active semiconductor layer 100.

Specifically, the opening OP_3 may overlap the active semiconductor layer 100 in a plan view, and in the overlapping area, the opening OP_3 may have substantially the same pattern as the active semiconductor layer 100. For example, the opening OP_3 may be disposed in an area where the active layer of the third transistor T3 is disposed to expose the active layer of the third transistor T3 in a plan view to have a planar pattern that is substantially the same as the planar pattern of the active layer of the third transistor T3.

The lower semiconductor layer AS_3 may be disposed under the first transistor T1 and may not be disposed under the third transistor T3, thereby individually controlling the element characteristics of the first transistor T1 and the third transistor T3. Further, the light blocking pattern 330 (refer to FIG. 8) may be applied with substantially the same voltage as the gate electrode of the third transistor T3 (T3_1 and T3_2), and thus element characteristics of the third transistor T3 (T3_1 and T3_2) may be improved.

Figure 20:
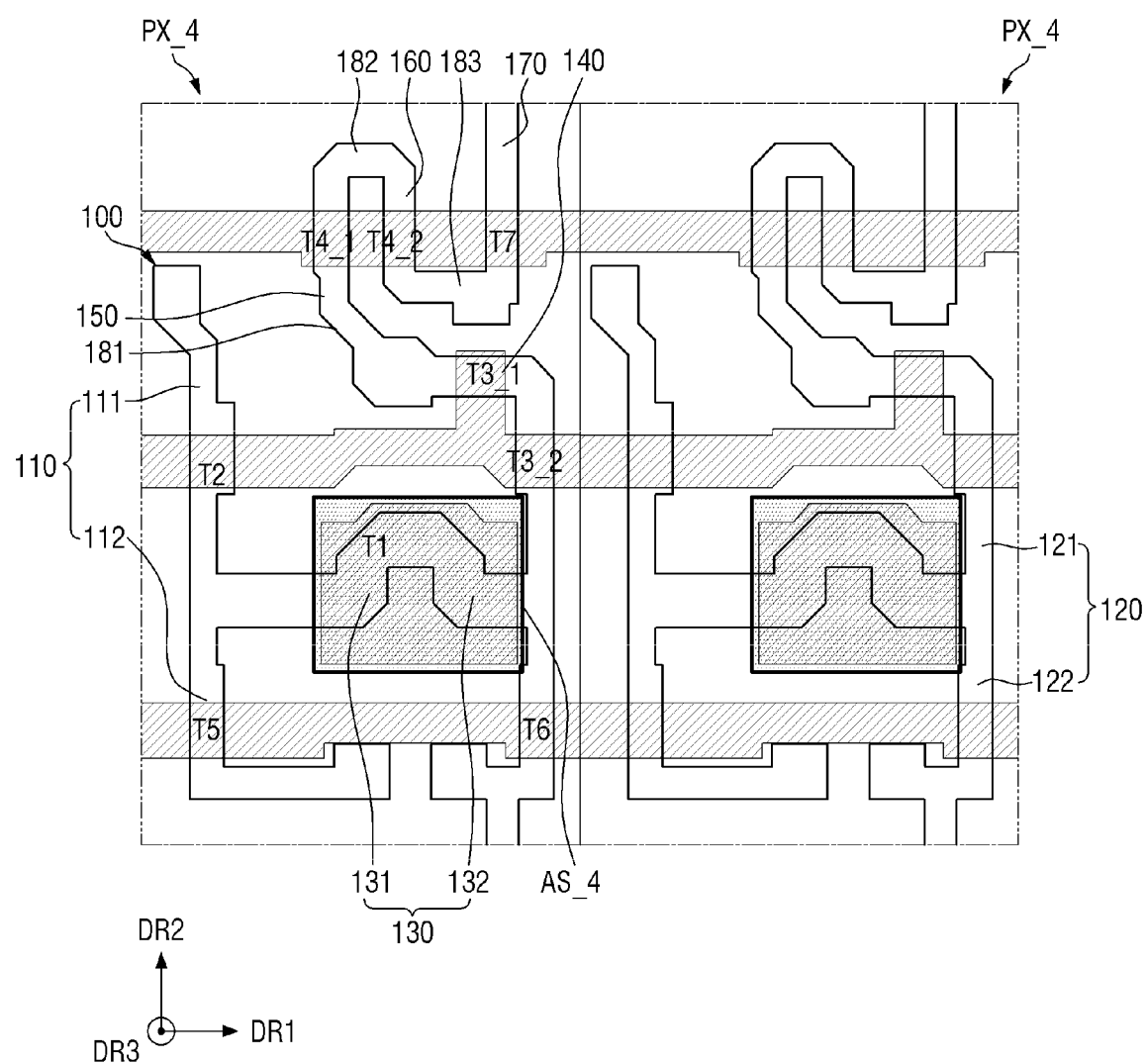
FIG. 20 is a layout view of a lower semiconductor layer, a semiconductor layer, and a first conductive layer of a pixel according to another embodiment.

FIG. 20 is a layout view of a lower semiconductor layer, a semiconductor layer, and a first conductive layer of a pixel according to another embodiment.

Referring to FIG. 20, the present embodiment is different from the embodiment described with reference to FIG. 5 in that a pixel PX_4 includes a lower semiconductor layer AS_4 that is selectively disposed only under the first transistor T1.

Specifically, the lower semiconductor layer AS_4 may be disposed only in a part of the area of the pixel PX_4. For example, the lower semiconductor layer AS_4 may be selectively disposed only under the first transistor T1. The lower semiconductor layer AS_4 may overlap the active layer of the first transistor T1 in the thickness direction, but may not overlap the active layers of the second to seventh transistors T2 to T7. In this case, the lower semiconductor layer AS_4 may not include the opening OP (refer to FIG. 5), and the lower semiconductor layer AS_4 may be patterned and disposed in the pixel PX_4. The lower semiconductor layer AS_4 may have various shapes in a plan view. For example, the lower semiconductor layer AS_4 may have a quadrangular shape, but is not limited thereto, and may include a polygonal shape such as a rectangle, a square, or a pentagon, or may have a circular shape or an elliptical shape.

Although it is shown in FIG. 20 that the lower semiconductor layer AS_4 is disposed under the first transistor T1, the present disclosure is not limited thereto, and the lower semiconductor layer AS_4 may be further disposed under at least one of the second transistor T2 and the fourth to seventh transistors T4 to T7.

The lower semiconductor layer AS_4 may be disposed under the first transistor T1 and may not be disposed under the third transistor T3, thereby individually controlling the element characteristics of the first transistor T1 and the third transistor T3. Further, the light blocking pattern 330 (refer to FIG. 8) may be applied with substantially the same voltage as the gate electrode of the third transistor T3 (T3_1 and T3_2), and thus element characteristics of the third transistor T3 (T3_1 and T3_2) may be improved. Furthermore, the lower semiconductor layer AS_4 that is selectively disposed may individually control element characteristics of not only the first transistor T1 and the third transistor T3 but also the second transistor T2 and the fourth to seventh transistors T4 to T7.

Although some embodiments of the present disclosure have been disclosed for illustrative purposes, those skilled in the art will appreciate that various modifications, additions, and substitutions are possible, without departing from the scope and spirit of the present disclosure including the accompanying claims.

What is claimed is:

1. A display device, comprising:
a base substrate including a first substrate and a second substrate sequentially laminated;
a lower semiconductor layer disposed on at least one of the first substrate and the second substrate;
a buffer layer disposed on the base substrate;
an active semiconductor layer disposed on the buffer layer and including a first active layer of a first transistor and a second active layer of a second transistor;
a first insulating layer disposed on the active semiconductor layer; and
a first conductive layer disposed on the first insulating layer and including a first gate electrode of the first transistor and a second gate electrode of the second transistor,
wherein the lower semiconductor layer overlaps the first active layer, and does not overlap the second active layer.

2. The display device of claim 1, further comprising:
a light emitting element,
wherein the first transistor includes a first electrode and a second electrode and controls a driving current flowing from the first electrode to the second electrode according to a voltage applied to the first gate electrode,
wherein the second transistor is disposed between the first gate electrode and the first electrode of the first transistor, and
wherein the light emitting element is electrically connected to the second electrode of the first transistor and emits light according to the driving current.

3. The display device of claim 1,
wherein the lower semiconductor layer includes amorphous silicon.

4. The display device of claim 3,
wherein the active semiconductor layer includes at least one of polycrystalline silicon and an oxide semiconductor.

5. The display device of claim 1,
wherein the lower semiconductor includes an opening that overlaps at least a portion of a channel region of the second transistor in a thickness direction.

6. The display device of claim 1,
wherein the lower semiconductor layer is disposed between the first substrate and the second substrate, and
wherein the lower semiconductor layer has a thickness ranging from 1 nm to 5 nm.

7. The display device of claim 1,
wherein the lower semiconductor layer is disposed above the first substrate and the second substrate, and
wherein the lower semiconductor layer has a thickness ranging from 20 nm to 50 nm.

8. The display device of claim 1, further comprising:
a second insulating layer disposed on the first conductive layer; and
a light blocking pattern disposed on the second insulating layer and at least partially overlapping the second active layer of the second transistor,
wherein a same voltage is applied to the light blocking pattern and the second gate electrode of the second transistor.

9. The display device of claim 8, further comprising:
a third insulating layer disposed on the light blocking pattern; and
a second conductive layer disposed on the third insulating layer and including a connection pattern,
wherein the first conductive layer further includes a first scan line electrically connected to the first gate electrode of the first transistor and the second gate electrode of the second transistor, and
wherein the connection pattern is electrically connected to the light blocking pattern through a first contact hole that penetrates through the third insulating layer to expose the light blocking pattern, and is further electrically connected to the first scan line through a second contact hole that penetrates through the third insulating layer and the second insulating layer to expose the first scan line.

10. The display device of claim 9,
wherein a scan signal is applied to the light blocking pattern and the second gate electrode of the second transistor.

11. The display device of claim 10,
wherein the second conductive layer further includes the first electrode and the second electrode of the first transistor.

12. The display device of claim 8,
wherein the first conductive layer further includes a first scan line electrically connected to the first gate electrode of the first transistor and the second gate electrode of the second transistor,
wherein the light blocking pattern overlaps the first scan line, and
wherein, in an area overlapping the first scan line, the light blocking pattern is electrically connected to the first scan line through a third contact hole that penetrates through the second insulating layer to expose the first scan line.

13. The display device of claim 8,
wherein the second transistor includes a first sub-transistor and a second sub-transistor to which a same scan signal is applied, and
wherein the light blocking pattern overlaps a connection region that connects a first channel region of the first sub-transistor and a second channel region of the second sub-transistor.

14. A display device, comprising:
a first transistor including a first active layer including a first channel region overlapping a first gate electrode and controlling a driving current flowing through the first channel region according to a voltage applied to the first gate electrode;
a light emitting element electrically connected to the first transistor and emitting light according to the driving current;
a second transistor electrically connected to the first gate electrode of the first transistor and including a second active layer including a second channel region; and
a lower semiconductor layer disposed under the first active layer of the first transistor and overlapping at least at portion of the first channel region of the first transistor,
wherein the lower semiconductor layer does not overlap the second channel region of the second transistor.

15. The display device of claim 14,
wherein the lower semiconductor layer includes amorphous silicon.

16. The display device of claim 15,
wherein each of the first active layer and the second active layer includes at least one of polycrystalline silicon and an oxide semiconductor.

17. A display device, comprising:
a substrate;
a lower semiconductor layer disposed on the substrate;
a buffer layer disposed on the lower semiconductor layer;
a first transistor including a first sub-transistor and a second sub-transistor;
an active semiconductor layer disposed on the buffer layer and including a first channel region of the first sub-transistor and a second channel region of the second sub-transistor;
a first insulating layer disposed on the active semiconductor layer;
a first conductive layer disposed on the first insulating layer including a first gate electrode of the first sub-transistor and a second gate electrode of the second sub-transistor;
a second insulating layer disposed on the first conductive layer; and
a light blocking pattern disposed on the second insulating layer and overlapping a connection region that connects the first channel region of the first sub-transistor and the second channel region of the second sub-transistor,
wherein a same voltage is applied to the light blocking pattern, the first sub-transistor, and the second sub-transistor.

18. The display device of claim 17,
wherein the lower semiconductor layer does not overlap the first channel region of the first sub-transistor and the second channel region of the second sub-transistor.

19. The display device of claim 18, further comprising:
a third insulating layer covering the light blocking pattern; and
a second conductive layer disposed on the third insulating layer and including a connection pattern,
wherein the first conductive layer further includes a first scan line electrically connected to the first gate electrode of the first sub-transistor and the second gate electrode of the second sub-transistor, and
wherein the connection pattern is electrically connected to the light blocking pattern through a first contact hole that penetrates through the third insulating layer to expose the light blocking pattern, and is further electrically connected to the first scan line through a second contact hole that penetrates through the third insulating layer and the second insulating layer to expose the first scan line.

20. The display device of claim 18,
wherein the first conductive layer further includes a first scan line electrically connected to the first gate electrode of the first sub-transistor and the second gate electrode of the second sub-transistor,
wherein the light blocking pattern overlaps the first scan line, and
wherein, in an area overlapping the first scan line, the light blocking pattern is electrically connected to the first scan line through a third contact hole that penetrates through the second insulating layer to expose the first scan line.

* * * * *